United States Patent [19]
Allen et al.

[11] Patent Number: 5,325,092
[45] Date of Patent: Jun. 28, 1994

[54] HUFFMAN DECODER ARCHITECTURE FOR HIGH SPEED OPERATION AND REDUCED MEMORY

[75] Inventors: James Allen, Castro Valley; Martin Boliek, Palo Alto; Edward L. Schwartz, Sunnyvale; David Bednash, Palo Alto, all of Calif.

[73] Assignee: Ricoh Company, Ltd., Menlo Park, Calif.

[21] Appl. No.: 909,903

[22] Filed: Jul. 7, 1992

[51] Int. Cl.⁵ .............................................. H03M 7/40
[52] U.S. Cl. .......................................... 341/65; 341/67
[58] Field of Search ...................... 341/65, 67

[56] References Cited

U.S. PATENT DOCUMENTS

| | | | |
|---|---|---|---|
| 4,647,908 | 3/1987 | Ross et al. | 341/65 |
| 4,899,148 | 2/1990 | Sato et al. | 341/65 |
| 4,899,149 | 2/1990 | Kahan | 341/67 |
| 5,091,955 | 2/1992 | Iseda et al. | 381/36 |
| 5,138,316 | 8/1992 | Konishi | 341/67 |

*Primary Examiner*—Marc S. Hoff
*Attorney, Agent, or Firm*—Townsend and Townsend Khouire and Crew

[57] ABSTRACT

Various Huffman decoder architectures are presented. By these decoder architectures, more than one codeword in a stream of Huffman-coded data units may be decoded into more than one token in a single decoding operation on average. An efficient memory organization which is useful in many of these decoder architectures is also presented.

51 Claims, 11 Drawing Sheets

CODEWORD LENGTH +
MANTISSA LENGTH

HUFFMAN DECODER ARCHITECTURE FOR HIGH SPEED OPERATION AND REDUCED MEMORY

BACKGROUND OF THE INVENTION

The present application is related to decoders for decompressing Huffman-coded data and, more particularly, to the architecture of high-speed decoders of Huffman-coded data.

In Huffman coding, units of original data are compressed into coded units consisting of codewords of varying lengths and optional non-Huffman coded words. The codewords are selected so that the most frequently occurring units of original data have the shortest length, i.e., the smallest number of bits, and the least frequently occurring units of original data have the largest codewords. In this manner, the original data is compressed into coded data. This is a general description of Huffman coding techniques and, of course, the selection and generation of Huffman codes for particular applications may be expressed with much greater precision.

The application of Huffman coding is typically used where there is a large amount of data which must be processed or transferred, such as digital image processing. For example, color images processed according to the JPEG (Joint Photographic Experts Group) standard, and the standard's Huffman coding, typically handle a large number of data units. Huffman coding is found in present and emerging digital video processing standards.

Included in these standards is the previously mentioned JPEG standard, which is a standard for still images. Existing and emerging standards for motion video systems, such as H.261, a CCITT video teleconferencing standard, and the Motion Picture Experts Group (MPEG) I, have coding systems which are very similar to the JPEG standard. In turn, the MPEG standards are related to the nascent High Definition Television (HDTV) technology. The commonality between HDTV, MPEG, H.261 and JPEG is expected to include Huffman coding.

Where Huffman coding is used, decoding of the Huffman-coded units must naturally be performed. In the decoding of each coded unit, a token is generated from each codeword. Each token, because it is unique, contains enough information about the coded unit (and original data unit) to be used as control information to assemble, or decompress, the coded unit into the original data unit.

A significant and fundamental problem is found in the decoding operation which generates each token from a codeword. The problem arises when high-speed decoding of the coded units is required. In decoding a stream of Huffman-coded units in a typical Huffman decoder, each unit contains a codeword and optional non-code words of varying length, which creates difficulty for high-speed decoding.

This difficulty in decoding Huffman-coded data at high speed poses a serious impediment to emerging technology. As explained above, it is likely that the emerging digital HDTV standards will incorporate Huffman coding. An estimate of HDTV requirements leads to the processing of pixel components at 100 million data units per second. To solve this problem, the present invention provides for novel Huffman decoding architectures in which coded units are decoded in parallel.

Various embodiments for Huffman decoder architectures are presented. These Huffman decoder architectures, all capable of high-speed operation, use differing amounts of memory and logic. The balance of memory and logic has different space/speed tradeoffs in the particular technology implemented by an integrated circuit designer. Thus the present invention offers high-speed alternatives for most, if not all, of the specific applications of Huffman decoders. The present invention permits the selection of the optimum decoder architecture.

SUMMARY OF THE INVENTION

The present invention provides for Huffman decoder architectures by which, on average, more than one codeword in a stream of Huffman-coded data units may be decoded into more than one token in a single decoding operation.

One embodiment of the present invention is a wide table decoder architecture. Units of Huffman-coded data are received through a bit shifter unit. A large memory unit, acting as a large look-up table, is connected to the bit shifter. The memory unit simultaneously generates tokens and control bits corresponding to the length of the input for each of the complete codewords. These control bits are fed back to the bit shifter which shifts the total length of the coded units for the next decoding operation. Thus, on average, more than one token per look-up cycle is obtained.

Another embodiment of the present invention provides for a staggered decoder architecture. As in the case of the wide table architecture, a bit shifter holds the bits of the Huffman-coded data. Several look-up table units are connected to the bit shifter, each unit with a different offset. Each table looks up a different part of the coded input whether it creates a valid token or not. Combinatorial logic, connected to the look-up table units, determines which of the units has generated valid tokens. Once again more than one token per look-up cycle is obtained on average.

A variation of this embodiment provides for a predetermined number of bits to be shifted into the bit shifter for each decoding operation. Decoding is performed at a constant rate. The validity of the tokens from the look-up table units is determined in a pipelined manner. A second variation of the staggered table decoder architecture has one or more of the look-up tables after the initial position capable of decoding only a preselected subset of codewords. These codewords may be those most likely to occur in the particular application. This reduces the amount of memory needed because only one table, the first, is required to be capable of all token look-up operations.

Another embodiment of the present invention is a control memory architecture. A bit shifter, as described previously, receives the units of Huffman-coded data. A control memory is connected to the bit shifter and only contains the control bits corresponding to the total length of coded units having complete codewords at the address terminals. These control bits are fed back to the bit shifter which shifts the coded data by the total length of the coded data for the next decoding operation. Decoding of the codewords in the coded units is performed sequentially by several look-up table units, each unit a look-up table for tokens from codewords, connected in a pipeline. A latch and a shifter are associated with each of the look-up table units for the pipeline connection.

A variation of this control memory decoder architecture, adapted for JPEG data, requires that the first look-up table decode only a subset of possible codewords, those for the DC coefficients. The remaining look-up tables decode only a subset of possible codewords, those for AC coefficients. Thus memory space is minimized.

The present invention also provides for an efficient memory organization for a Huffman decoder. The organization uses several smaller memory units. Each of the memory units is addressed in an interleaved manner. Combinatorial logic selects the memory unit for the decoded digital image data. The amount of memory space required to decode the Huffman-coded data is substantially reduced with this interleaved connection of separate memory units.

BRIEF DESCRIPTION OF THE DRAWINGS

A more detailed understanding of the present invention may be attained by a perusal of the following Detailed Description of Preferred Embodiment(s) with reference to the following drawings.

DETAILED DESCRIPTION OF PREFERRED EMBODIMENT(S)

The present invention is directed toward the general problem of high speed decoding of Huffman codewords in a stream of coded units. Thus, while the description of the present invention is often made in the context of a particular application of Huffman coding, a JPEG example, the present invention has broader applications than a JPEG Huffman decoder.

Figure 1:
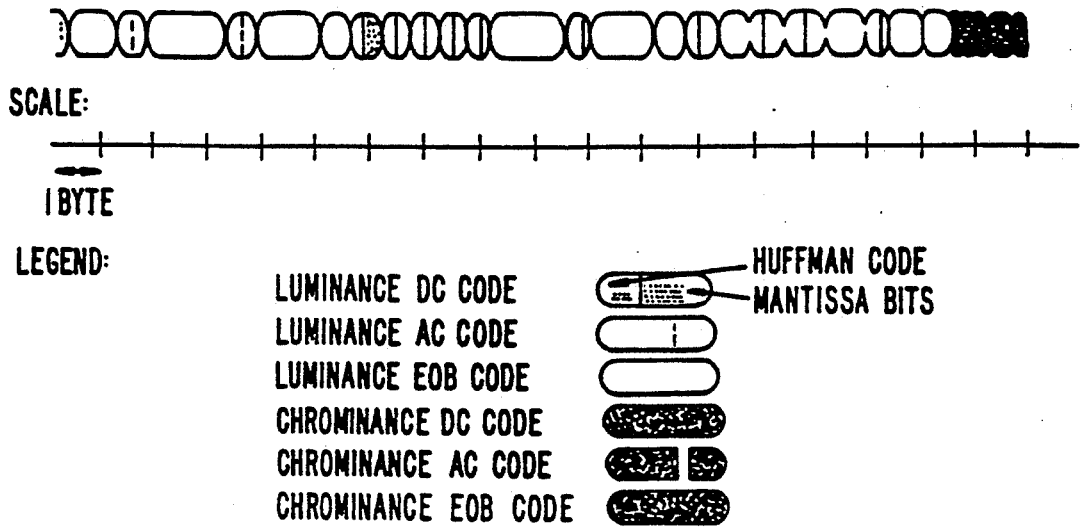
FIG. 1 illustrates a representational stream of Huffman-coded data units.

FIG. 1 is an exemplary representation of a stream of coded units under a JPEG standard. Each oblong unit represents a coded unit of data, containing a Huffman codeword and sometimes non-coded words. In this example, the non-coded words are the mantissa bits of the DC and AC coefficients for luminance and chrominance defined under JPEG. Other coded units contain codewords only, including those for JPEG End of Block and escape controls. It should be noted that most of the coded data units are short, less than one byte long, with an occasional long unit. The digital image has been compressed under the JPEG standard.

Figure 2A:
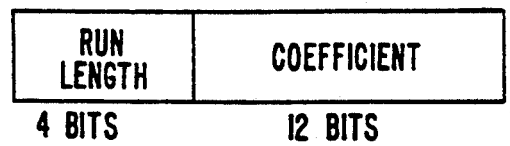
FIG. 2A is a representation of JPEG coefficient data separated into zero run length and coefficient magnitude fields.
Figure 2B:
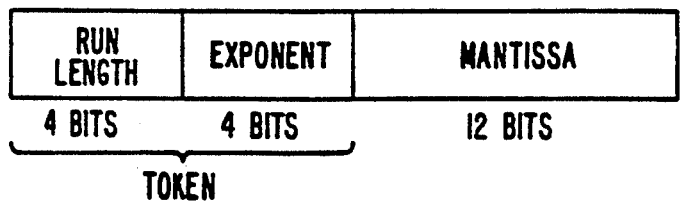
FIG. 2B shows the coefficient magnitude data separated into an exponent field and mantissa field.
Figure 2C:
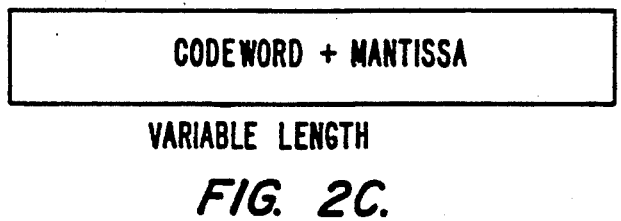
FIG. 2C shows the coded data formed by a variable length Huffman codeword and the mantissa bits.

FIGS. 2A-2C illustrates Huffman coding in the context of JPEG. Under JPEG, the components of pixels of a digital image are reduced into the coefficients of a discrete cosine transform of 8×8 pixel blocks. As shown in FIG. 2A, a run length bit field is attached to each non-zero coefficient recording the number of zero valued coefficients in a run (in a zig-zag order). The coefficient field represents the size of the coefficient. Each coefficient, shown in FIG. 2B, is then separated into a mantissa field and an exponent field. The coding of this original data unit is performed by the substitution of a predetermined Huffman codeword for the run length and exponent fields, the token in this case, as illustrated in FIG. 2C. The Huffman codeword plus the mantissa bit field is the coded unit. For coefficients which do not have a mantissa, the codeword alone is the coded unit.

Many of the details of the JPEG coding process are omitted here. It is sufficient to note for the purposes of the present invention that the coded units are of varying length. As explained above, this leads to the difficulty in decoding the coded units to generate a token used to decompress the coded units into the original data units.

Figure 3:
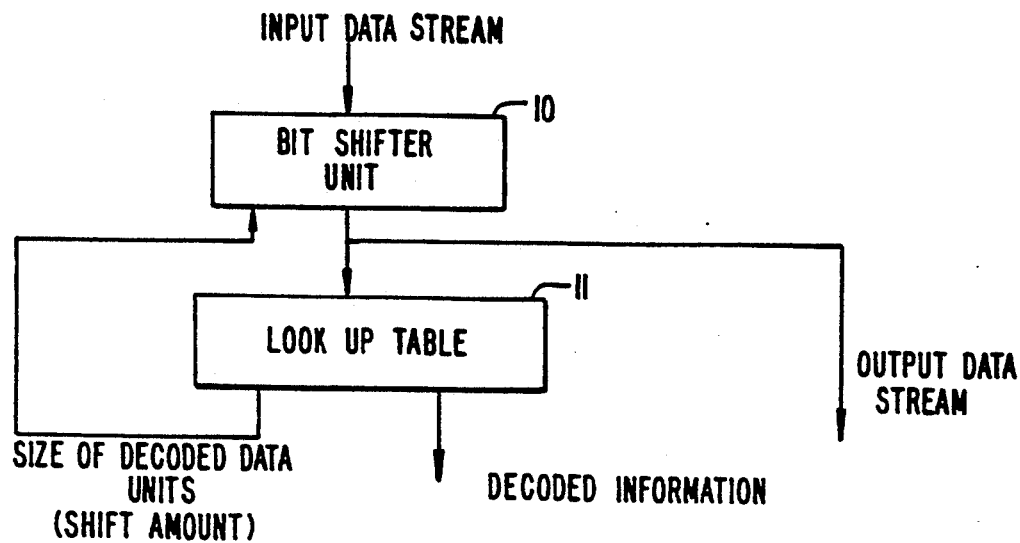
FIG. 3 illustrates a general organization of a Huffman decoder.

This general problem with Huffman decoders is demonstrated by a general organization of a Huffman decoder shown in FIG. 3. The decoder has a bit shifter unit 10, basically a barrel shifter, which accepts a parallel stream of coded units. The unit 10 is connected to a look-up table 11 for generating the tokens from the codewords in the stream of coded units. In parallel, the bits address locations in the look-up table 11 if the table 11 is a memory unit, or form the input signals for logic combination if the table 11 is a combinatorial logic block. In any case, a token is generated at the output of the table 11. From this look-up operation of a codeword, the length of the data unit to which the codeword belongs is determined. This length information is fed back as control signals to the bit shifter unit 10 so that the codeword of the next data unit is shifted into position for a look-up. Thus the look-up, or decoding, of each codeword proceeds sequentially due to the variability in the length of the Huffman codewords and coded data units.

Figure 5:
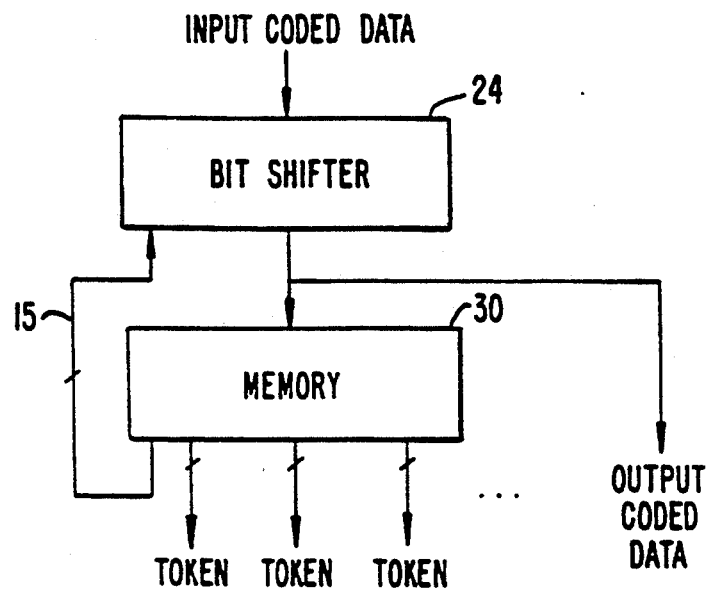
FIG. 5 shows one embodiment of the present invention, a decoder having a wide look-up table memory.
Figure 10A:
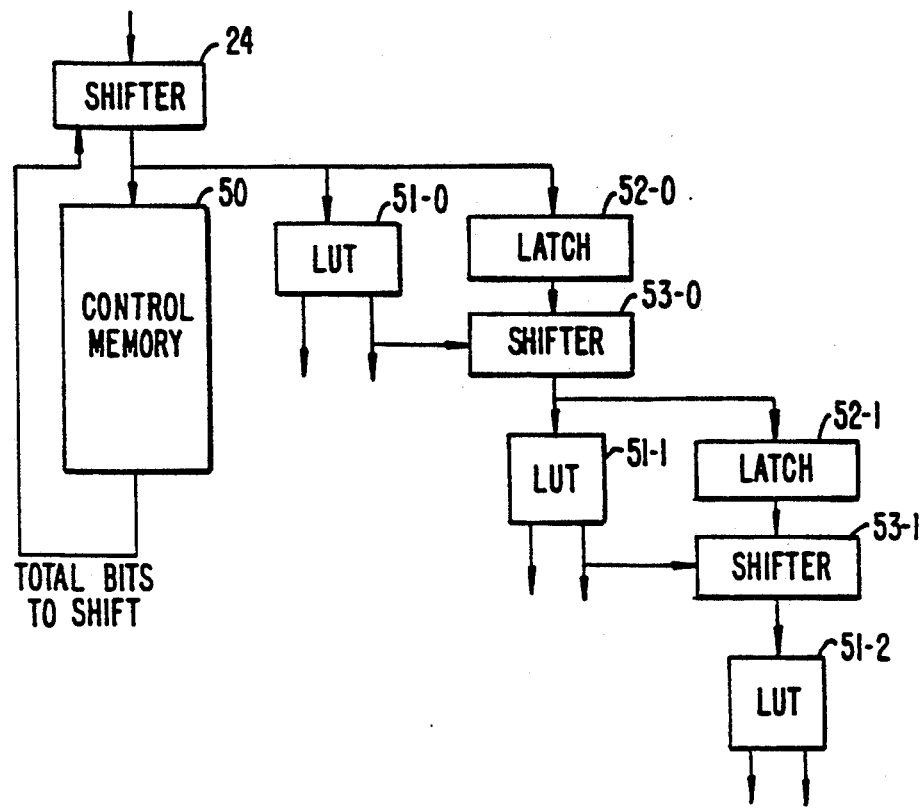
FIG. 10A illustrates another embodiment of the present invention, a control memory decoder with multiple look-up tables for pipelined decoding.

The present invention avoids this sequential decoding. In each of the decoder architectures according to the present invention, there is a bit shifter unit 24, as shown in FIGS. 5, 8 and 10A.

Each of the cells of the bit shifter 24 is connected to the address terminals of one or more memory units in various arrangements as explained below. The memory units operate as look-up tables for codewords which have been shifted into the cells of the register 24. The look-up tables generate a token for each codeword. For the JPEG example, 13 bits total are generated as output signals from the memory units; 4 bits of run length, 4 bits for the exponent, and 5 bits for the control word, called the length, for shifting the bitstream. Five bits of control are needed because the maximum length of a JPEG coded unit is 27 bits. To represent an invalid token a control word of zero can be used, for example. Other means can be used to represent an invalid token.

The memory units are in the form of random access memory (RAM) which may be flexibly loaded with the tokens of a particular Huffman code once the Huffman code has been defined, or read only memory (ROM) if the Huffman code is known beforehand. Of course, units of combinatorial logic could also be used as an alternative to ROM units.

Figure 4:
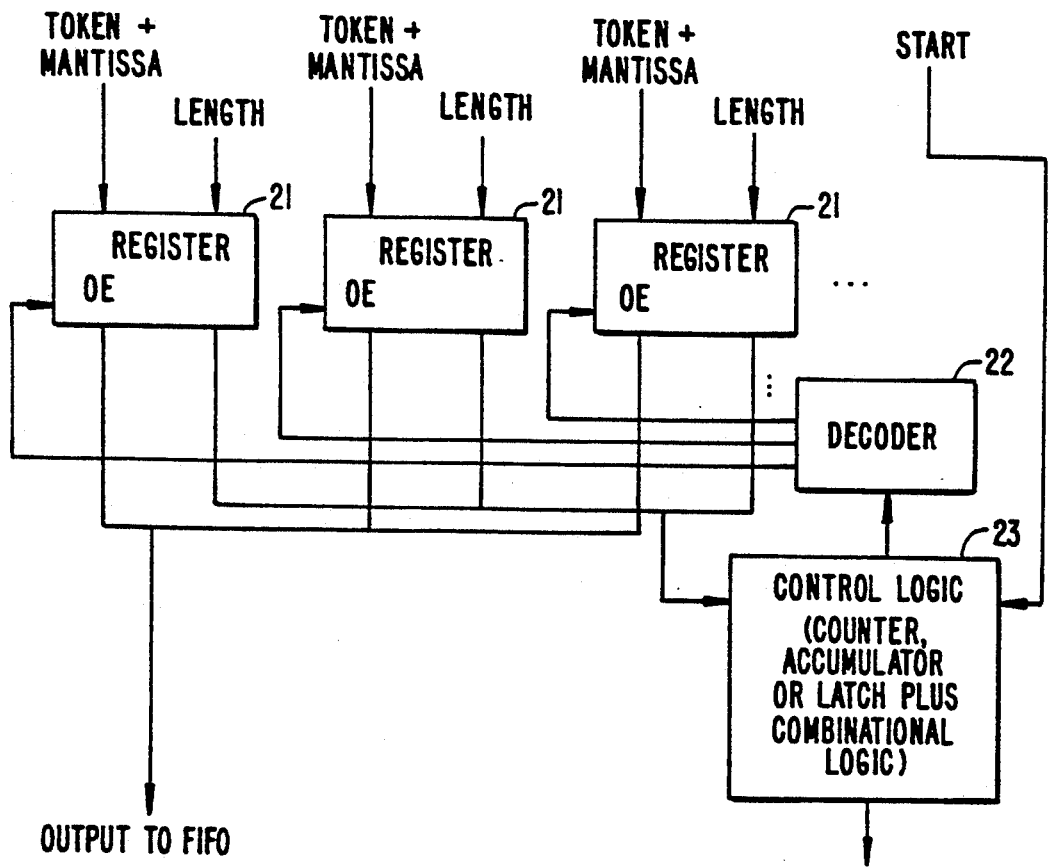
FIG. 4 is a block diagram of circuitry used to multiplex several decoded tokens into a single stream.

All of the various embodiments of the present invention generate multiple tokens simultaneously. These tokens must be placed in an ordered stream of data. FIG. 4 shows a circuit for handling multiplexing operations for this function. Registers 21 are loaded each time the Huffman decoder completes a cycle. Each of the registers 21 is loaded with a decoded token, any optional noncoded words (the mantissa bits in the JPEG example), if any, and the bits indicating the total length of the decoded data unit. The tokens and bits indicating length are produced from each of the various Huffman decoders described below, and the optional noncoded words are produced from the coded data.

A start signal from system control logic (not shown) indicates the multiplexing is to be performed. A control logic block 23 receives the start signal and signals from the registers 21 indicating the lengths of the data units. The block 23 sequentially selects (via a decoder 22) the particular registers 21 which hold valid tokens. The block 23 also provides a signal to a FIFO (first-in, first-out) register, which is not shown, to indicate a valid input to the FIFO is available. The token and mantissa bits from each selected register 21 are loaded into the FIFO and the original data is reformed after exiting the FIFO. Reforming the data is a well-known operation. The particular configuration of the control logic block 23 depends upon the particular decoder architecture and is discussed below.

The time required for a token to be multiplexed into the FIFO is substantially less than the time required to perform a decode cycle. The overall control logic uses a clock which is m times faster than the clock used by the decoder, where m is the maximum number of decodes per cycle.

Wide Table Architecture

One embodiment of a high-speed decoder according to the present invention is a wide table architecture illustrated in FIG. 5. The input terminals of a single memory unit 30, a look-up table for the codewords, are connected to the individual cells of the bit shifter unit 24 so that the contents of the shifter 24 address locations in the memory unit 30, as described above. However, the memory unit 30 is wide to generate several possible tokens at once. In the JPEG example of FIGS. 1 and 2A-2C, the maximum length of a codeword is 16 bits and the typical size of each coded unit is less than a byte, 8 bits. Thus for JPEG, the memory unit 30 should have at least 16 input terminals. For other applications the typical number of input terminals to the memory is 12 to 20, for instance. In other words, the memory unit 30 generates the correct tokens in parallel in one decoding operation. For each codeword in the shifter 24 at the address terminals of the memory unit 30, a token is generated.

The memory unit 30 also stores the control information for the bit shifter 24 for the total number bits to shift in the next decoding operation. For example, if tokens for two codewords corresponding to data units with lengths of 4 and 5 bits respectively, are decoded, then the control information for a 9-bit shift is sent back to the shifter 24 over control lines 15. If the total length of data units decoded amounts to 27 bits, then a 27-bit shift signal is sent over to the bit shifter unit 24.

Figure 6:
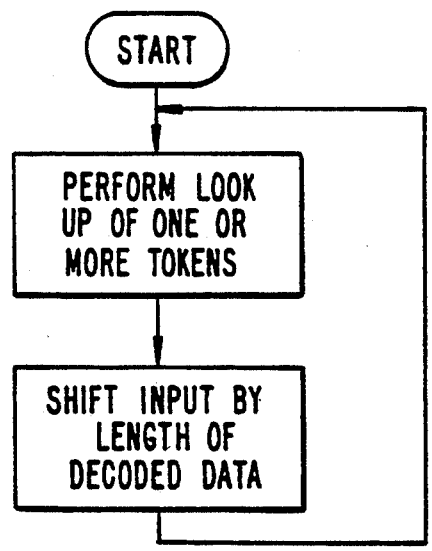
FIG. 6 is a flow chart of steps illustrating the operation of the decoder of FIG. 5.

The sequence of operational steps for the wide table decoder architecture is shown in FIG. 6. There are two basic steps. The first is that a look-up operation is performed at the input terminals of the memory unit 30 to determine whether one or more tokens are addressed and generated at the output terminals of the memory 30. The output from the memory unit 30 also includes the total length of all the decoded data units in the bit shifter 24. This information is fed back to the shifter 24 for shifting by that number of bits and the decoding operation is repeated.

For the wide look-up table architecture, the multiplexer control logic block 23 in FIG. 4 has a counter and a small amount of combinatorial logic. Operation with the block 23 follows the flow chart in FIG. 7. The counter, which indicates the position of a codeword at the input terminals of the memory unit 30, is initially zero. When a start signal occurs, the counter having value zero, enables the output of the register 21 at position zero. Validity of the token in that register is checked by determining whether the length of uncoded data unit corresponding to the token in the register 21 is zero or not. If the token is valid (length not zero), the block 23 asserts the FIFO input enable signal so that contents of the register 21 are loaded into the FIFO. If the token is invalid (length zero), the block 23 returns to the state awaiting the next decode cycle and a start signal after the counter is cleared. Assuming the token is valid, the counter increments so that it now has the position of the next register. A check is made whether the position is valid by checking if a maximum count has been reached. If not, the logic block 23 enables the next register 21 at the position indicated by the counter. A validity check of the token in the next is register is made and the steps are repeated until the maximum count is reached or an invalid token is found. The counter is then cleared for the next decode cycle and a start signal.

It is evident that the memory unit 30 may be quite large with many input and output terminals. The disadvantage of this wide memory architecture is that for an increasing number of n input terminals, the memory size increases as $2^n$. In certain circumstances the size of the memory unit 30 may be reduced and still achieve an effective parallel decoding operation. In this case, the primary token output, or the output for first positioned codeword in the bit shifter 24, is as described above. The output for that codeword must have sufficient bits to describe all possible tokens (13 bits for the JPEG example). However, the other parallel outputs for the following tokens may use fewer bits. Stochastic properties of the coded data determine the subset of tokens which can be decoded in the following codeword positions. These token outputs are chosen to be the most frequently occurring tokens. In the JPEG example, for instance, one extra output bit from the memory unit 30 output could be used to indicate that one of the following codewords is an End of Block codeword. Another example is that 9 bits of output can be used for tokens for the JPEG AC coefficients with no zero run length.

The memory described may be arranged in different organizations to handle the four Huffman codes for JPEG. Four separate and parallel memory units 30 may be used to handle the AC and DC, luminance and chrominance, Huffman codes. Control logic responsive to End of Block and the number of coefficients decoded keeps track and enables the proper memory units with control signals. Another arrangement increases the size of the single memory unit 30 to hold the look-up table contents for all four codes. Control logic similarly determine which code is to be decoded with two extra address lines to the memory.

These two memory organizations are also applicable to the memory units used as look-up tables in the other decoder architectures described below.

Staggered Tables Architecture

Figure 8A:
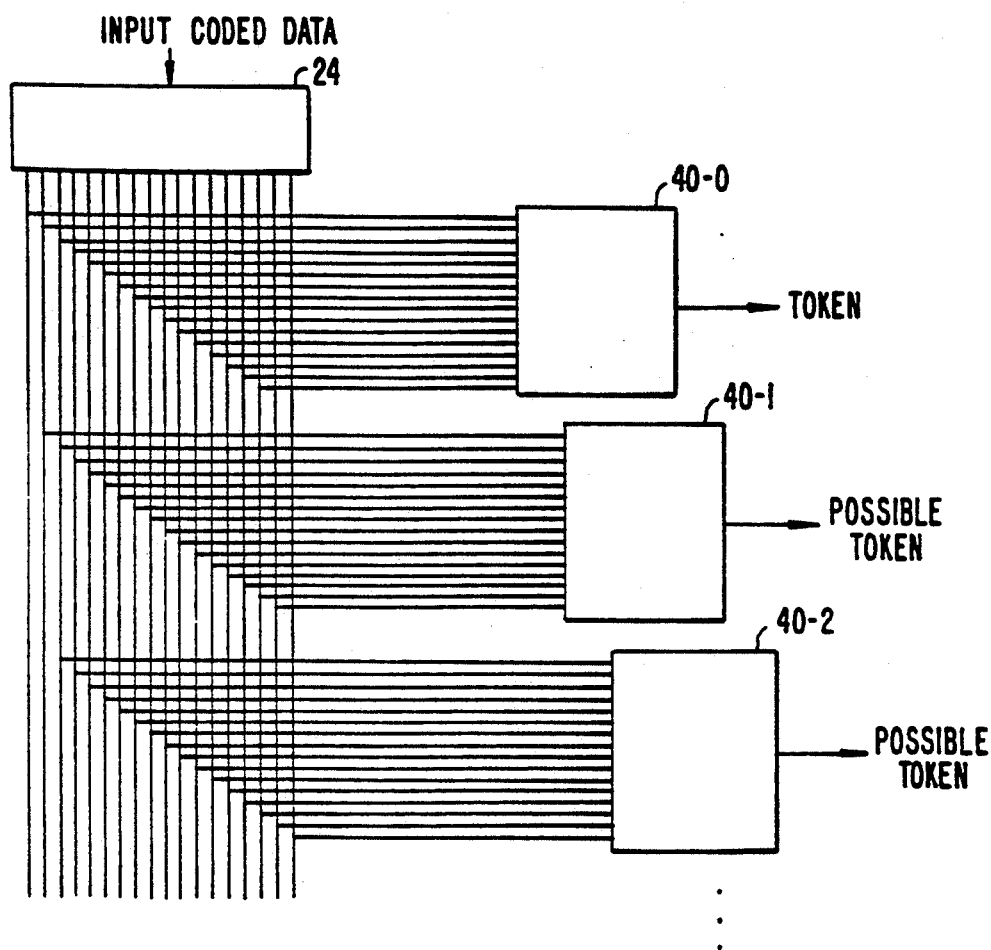
FIG. 8A shows another embodiment of the present invention, a decoder having staggered, look-up table ("LUT") units.
Figure 8B:
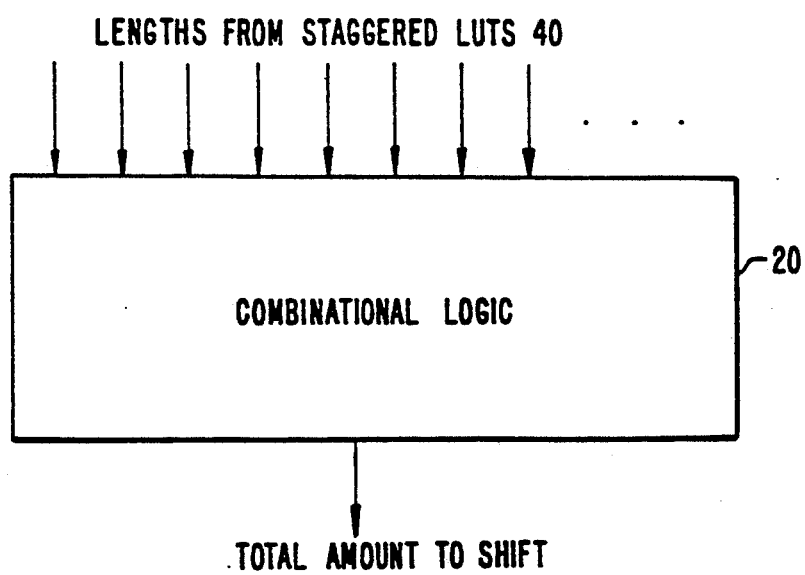
FIG. 8B is a general arrangement of a logic block which generates the length of coded data units from the outputs of the LUT units.

Another decoder architecture according to the present invention has several LUT (look-up table) units 40 connected to the cells of the bit shifter 24 in a staggered fashion, as shown in FIG. 8A. Each of the LUT units 40 is a look-up table for codewords in the coded data bitstream in the shifter 24 and the lengths of the codewords and any optional noncoded word (mantissa bits for the JPEG example). The first LUT unit 40-0 is connected to the cells of the shift register 24 in the initial position. In other words, the first LUT unit 40-0 is connected to the bit shifter cells starting from an initial cell 0. As shown in FIG. 8A, the LUT unit 40-0 is 16 bits wide (as are the other LUT units 40) to accommodate the largest possible codeword under the JPEG standard. (Note that the LUT units can be reduced in memory as explained with respect to FIGS. 12A and 12B). Thus the first LUT unit 40-0 is connected to cells 0-15 of the bit shifter 24. The connection of the next LUT unit 40-1 is staggered, or offset, by one cell so that it is addressed by cells 1-16 of the bit shifter 24. The following LUT unit 40-2 is connected to cells 2-17, and so forth.

The amount of offset in the location of each LUT unit 40 is determined by the particular application and the Huffman code used. The offset amount for the staggered LUT units 40 may be assigned in a probablistic manner for the best utilization of memory space. For example, if the most likely length of an uncoded data unit is four bits, then the second LUT 40-1 is connected to the bit shifter 24 starting at bit 4, the most likely position of the next uncoded data unit. Typically the amount of offset for the first stagger is based upon on the shortest coded unit possible. In the example shown in FIG. 8A, the next LUT 40-1 is located with a one-bit offset from the initial position, i.e., the shortest possible coded unit is one bit. Each LUT 40 has the possibility of being addressed by a valid codeword. Of course, if the Huffman code contains no codewords of length one, then no LUT 40 need be present at position 1.

Typically, since coded units can have any length between some minimum and maximum, the first staggered position is chosen based upon the minimum. The following positions are chosen consecutively. If, for example, a particular application had coded units that had even lengths with a much higher probability than odd lengths, placing staggered LUTs only at even positions might be optimal.

Referring back to the example of FIG. 8A, the first unit 40-0 always produces a valid output. The other LUT units 40 may produce a valid result if the input terminals of those LUT units are located at the start of a codeword. The output of first memory unit 40-0 indicates the LUT unit 40 which has the next valid result, and that unit 40, in turn, indicates the following unit 40 with a valid result, until all valid results are found.

Figure 9A:
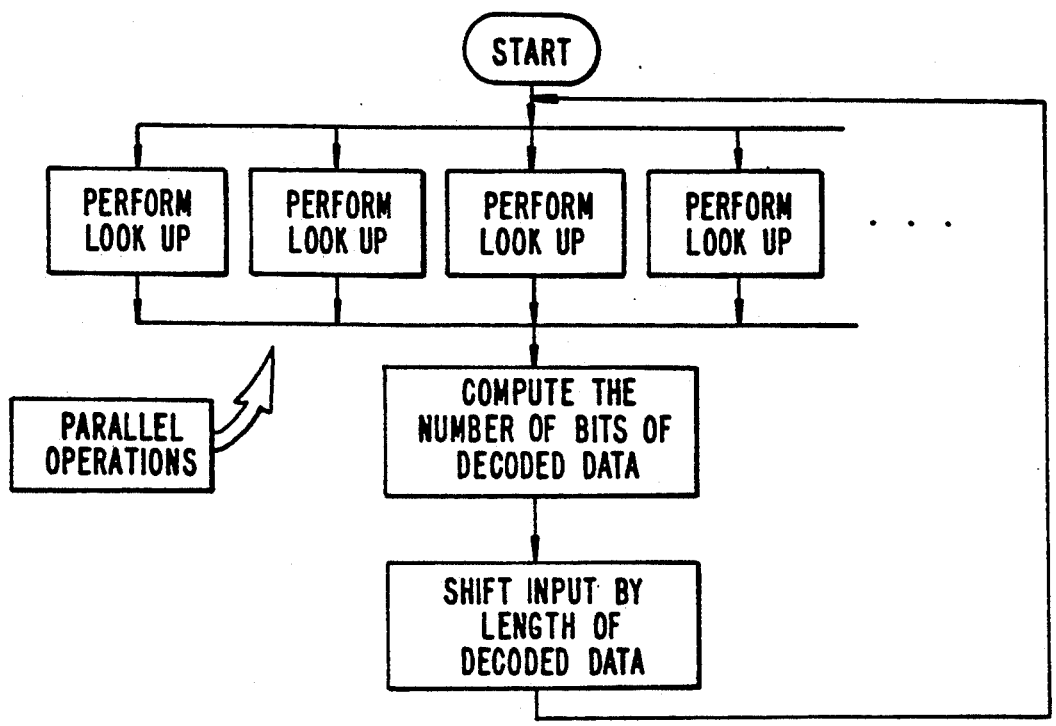
FIG. 9A is a flow chart of steps of the operation of the staggered table decoder of FIG. 8A.

FIG. 9A illustrates the steps for performing the decoding cycle with the staggered table architecture. First, a look-up operation is performed in parallel for all look-up table units 40. The total length of data units having codewords decoded into valid tokens is then computed, and the bit shifter 24 is then is shifted by the computed amount. Operation returns to the first step for the next decoding cycle.

This sequential operation to determine the total number of bits to shift in the register 24 appears to slow down the decoder operation. However, the feedback information for operating the shifter 24 for the next decode operation is just a 5-bit output function of a large number of input signals. Instead of performing the computations sequentially, the determination of the amount of bit-shifting may be implemented with hardwired logic, such as representationally shown in FIG. 8B, since the function is independent of the particular Huffman code used.

Exemplary appendices A and B, which are attached at the end of this specification, are truth tables which may be used to generate the hardwired logic block 20 for the staggered look-up table decoder architecture of FIG. 8A. Eight LUT units 40 are assumed, with a one-bit offset between each of the units 40. With a JPEG Huffman code, it is also assumed that the longest coded data unit is 27 bits.

In Appendix A the listed input numbers represent the length of the coded data unit at each staggered location. The output numbers are the total amounts to shift the bit shifter 24. Appendix B has the equivalent information shown differently. The listed input numbers represent the length of the coded data unit at each staggered location plus the position of the staggered location. The output numbers are the same as for Appendix A. Different combinatorial logic implementations result from the two tables.

Alternatively, since the output signals to the combinatorial logic block 20 are from LUT units 40, the signals may be arbitrary. Therefore an encoding of the size information may be chosen to simplify the logic block 20.

For the staggered table architecture, the multiplexer control logic block 23 in FIG. 4 has an accumulator and a small amount of logic. Its operation, very similar to that of the wide table decoder architecture, is also shown by the flow chart in FIG. 7. The accumulator, which indicates the staggered position of a codeword, is initially zero. When a start signal occurs, the accumulator, having value of zero, enables the output of the register 21 having the initial token at position zero. Validity of the token in that register is checked by determining whether the length of uncoded data unit corresponding to the token in the register 21 is zero or not.

If the token is valid (length not zero), the block 23 asserts the FIFO input enable signal so that contents of the register 21 are loaded into the FIFO. If the token is invalid (length zero), the block 23 returns to the state awaiting the next decode cycle and a start signal after the accumulator is cleared. Assuming the token is valid, the accumulator now has the staggered position of the next codeword. A check is made whether the position is valid by checking if a maximum count has been reached. If not, the logic block 23 enables the next register 21 at the position indicated by the accumulator. A validity check of the token in the next is register is made and the steps are repeated until the maximum count is reached or an invalid token is found. The accumulator is then cleared for the next decode cycle and a start signal.

Alternatively, the accumulator may be replaced with a latch if the length data in each register 21 is replaced by an input of the length plus the staggered position, as in the case of Appendix B. Operation remains the same.

A variation of this staggered look-up table decoder architecture avoids the time penalty for determining the total bits to shift the bit shifter 24. In this decoder architecture the bit shifter 24 shifts by a constant equal to the number of staggered LUT units 40 at a constant rate. The determination of which of the staggered look-up table memory units 40 are addressed by valid codewords is not required in the feedback signals to shift the shifter 24. This determination can be pipelined.

Figure 9B:
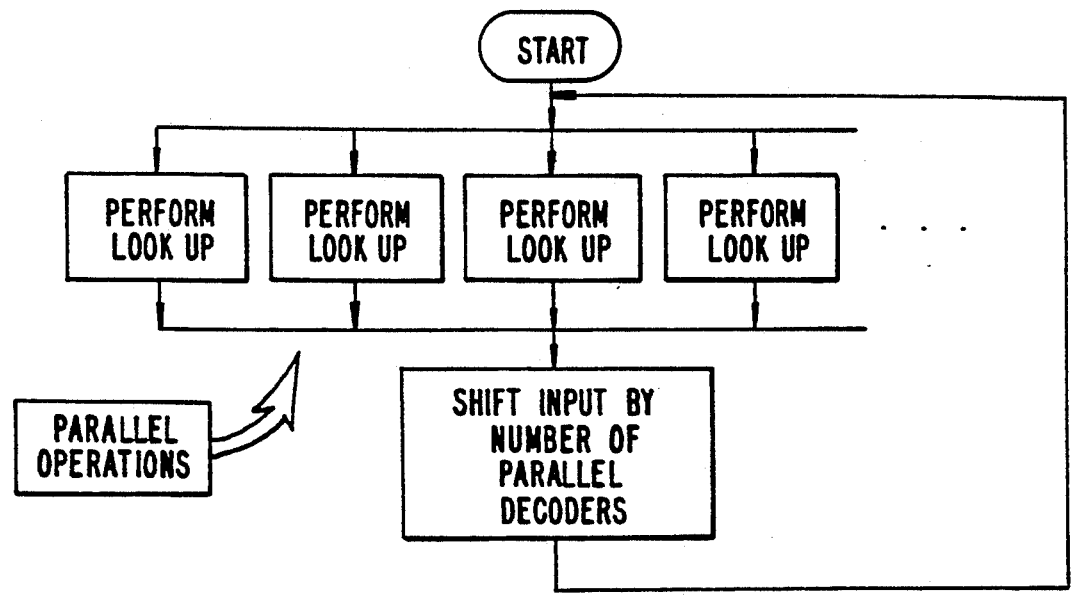
FIG. 9B is a flow chart of steps of the operation of a variation of the staggered table decoder of FIG. 8A.

Operational steps for a decoding cycle for this variation are shown in FIG. 9B. In this case, a parallel look-up is performed for all the LUT units 40. Then the bit shifter 24 is operated to shift the number of bits equal to the number of LUT units 40 before the next decoding cycle.

This architecture has a look-up table memory unit at every stagger position as described above with respect to FIG. 8A. However, unlike the description above, each produces multiple output tokens in parallel in an application having multiple Huffman codes. One such application is the JPEG example above. Four output tokens are produced in parallel, one token each for the AC Luminance, DC Luminance, AC Chrominance, and DC Chrominance Huffman codes. After each decode cycle, the shifter 24 is shifted by the number of staggered connections to the memory units so that every bit position in the input stream is decoded for every Huffman code. Since all possible results are available, no further decoding is necessary. The correct results are selected from all possible results after each decoding cycle. Control logic considers the decoded token from each bit position in the stream. Only when that bit position contains a valid codeword, the control logic selects the corresponding token for the current Huffman codeword and updates the count of how many bit positions to ignore until the next valid codeword. At this time the control logic also determines the Huffman code, AC Luminance, DC Luminance, AC Chrominance, and DC Chrominance, to which the next codeword belongs. Since the amount of shifting in the bit shifter 24 before each decode cycle is always constant, a barrel shifter in the unit 24 is not required, resulting in significant hardware savings.

This particular decoder architecture may have a particular applicability to HDTV. Instead of being limited to how many tokens per image area it can handle, the decoder architecture is limited by the number of input bits per image area. Since HDTV transmission data are more likely to specify a maximum bit rate, rather than a token rate, determining the number of staggered memory units required for a given coding standard might be easier. A disadvantage of this variation is that every bit position must be decoded in all four codes. This requires large memory units as look-up tables 40 at every staggered position.

Another variation of this decoder architecture also operates the bit shifter 24 to shift the number of the constant number of bits equal to the number of staggered LUT units 40. The amount of space required by the look-up table units 40 is also reduced. Since Huffman codewords do not appear with equal frequency, only the LUT unit 40-0 for the initial bit position must handle every possible codeword. LUT units 40-i (i>0) at other positions only need handle common or short codewords. As long as common codewords occur at other staggered positions in the bitstream, this variation operates as the previous variation. When a long or uncommon codeword occurs at a position that cannot handle it, an error signal is generated. The error signal uses the barrel shifter in the bit shifter unit 24 to restart the decoder with the offending bit position at the initial position of the shifter 24. Thus uncommonly occurring codewords are treated as an error condition. This subsequent "error" handling operation causes a time delay since some bit positions are decoded more than once.

Figure 9C:
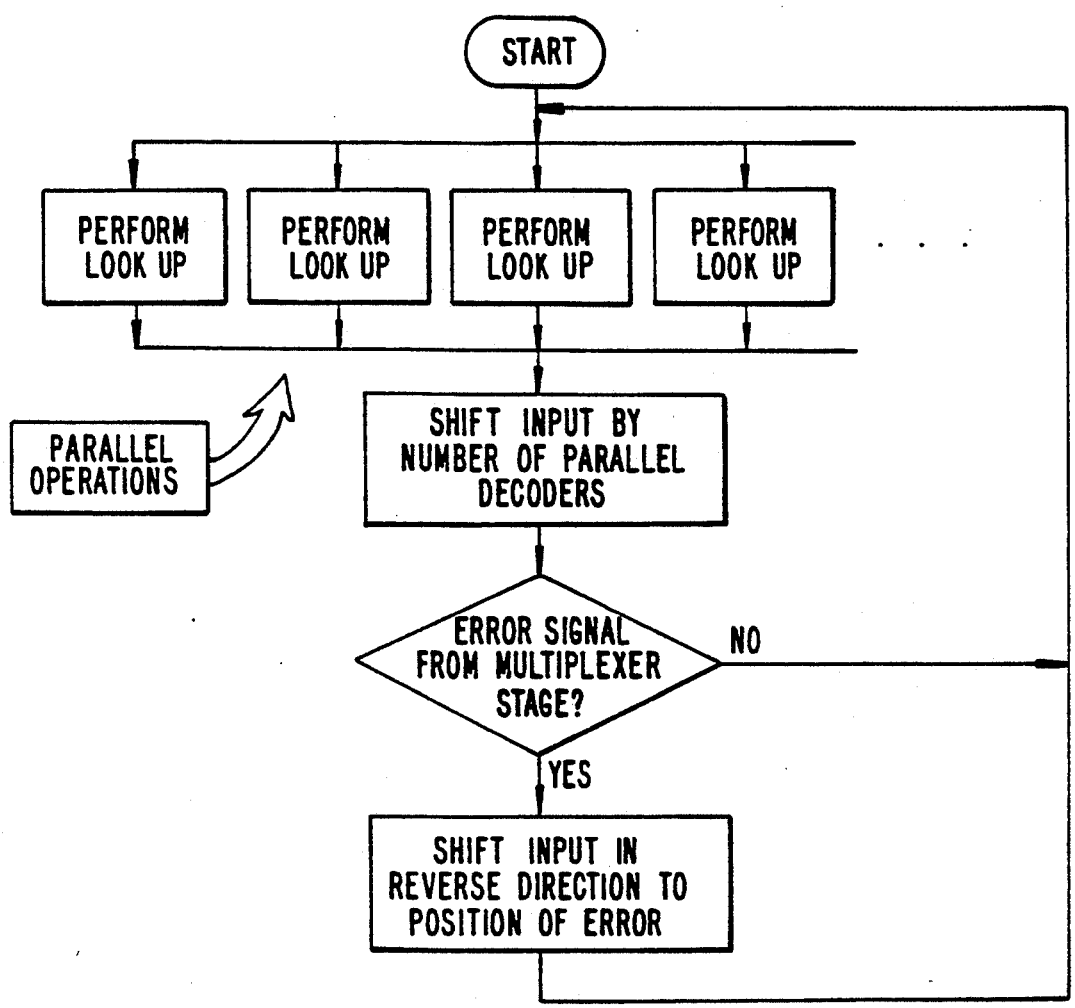
FIG. 9C is a flow chart of steps of the operation of a second variation of the staggered table decoder of FIG. 8A.

FIG. 9C illustrates the operational steps of the decoding cycle for this architectural variation. By the first step, a parallel look-up operation is performed by all the look-up tables 40. Then the bit shifter 24 is operated to shift the number of bits equal to the number of LUT units 40. A determination is then made if an error signal is generated by the multiplexer control logic block 23 associated with this decoder architecture. The operation of the circuit of FIG. 4 and the control logic block 23 is as described above with respect to FIG. 7. If all the LUTS 40 can handle (i.e., look up), their associated codewords, no error signal (length not zero, token valid) is generated, the decoding operation returns to the start for the next decoding cycle, as shown in FIG. 9C. If one of the reduced LUTs 40-i (i>0) cannot look-up its codeword and an error signal (length zero, token invalid) is generated, the barrel shifter, in the bit shifter unit 24, is operated in reverse to shift the bits to the location where the error is located. The offending codeword is placed in the initial bit position for decoding by the LUT 40-0, which is capable of handling all possible codewords. Operation is returned to the initial step for decoding once more.

Control Memory Architecture

FIG. 10A illustrates a control memory architecture. In this architecture, a control memory unit 50 is connected to the cells of the bit shifter unit 24. The memory 50 has many address locations but the number of output bits of each location is small. This small number of output bits specifies the information to be fed back to the bit shifter 24, i.e., the total number bits to shift for the next decode cycle, and End of Block signals.

The actual decoding is performed by multiple pipelined decoder stages. The decoding stages are pipelined with each stage having an input shift register 52 driven by the previous stage. Thus the bits in the shifter 24 address a first LUT unit 51-0, forming part of the first stage, to generate the output token of the codeword in the first position in the shift register 24. Included in the output are the bits specifying the length of the coded coefficient in the first position.

At the same time, the bits in the shifter 24 are also loaded into a latch 52-0 of the first pipeline stage. The bits in the latch 52-0 pass to a shift register 53-0 in the first stage. Under control of the output bits from the first stage LUT unit 51-0, the shift register 53-1 shifts by the length of the coded data unit. The shifted contents in the cells of the register 53-0 address an LUT unit 51-1 for the second pipeline stage. The LUT unit 51-1 generates the token, including length-specifying bits, for the next coded data unit in the bitstream passing through the bit shifter 24. At the next stage, the contents of the first stage shift register 53-0 are loaded into a second stage latch 52-1, which passes these bits into a second stage shift register 53-1. Responsive to the length-specifying output bits from the second stage LUT unit 51-1, the second stage shift register 53-1 shifts its contents, which then address a LUT unit 51-2 for the third stage. The LUT unit 51-2 then generates the token for the next data unit in the coded data. This pipelined decoding continues until all valid codewords from the bit shifter 24 are decoded. In the meantime, the next set of shifted bits from the bit shifter 24 is being decoded in a pipelined decoding operation.

Figure 11:
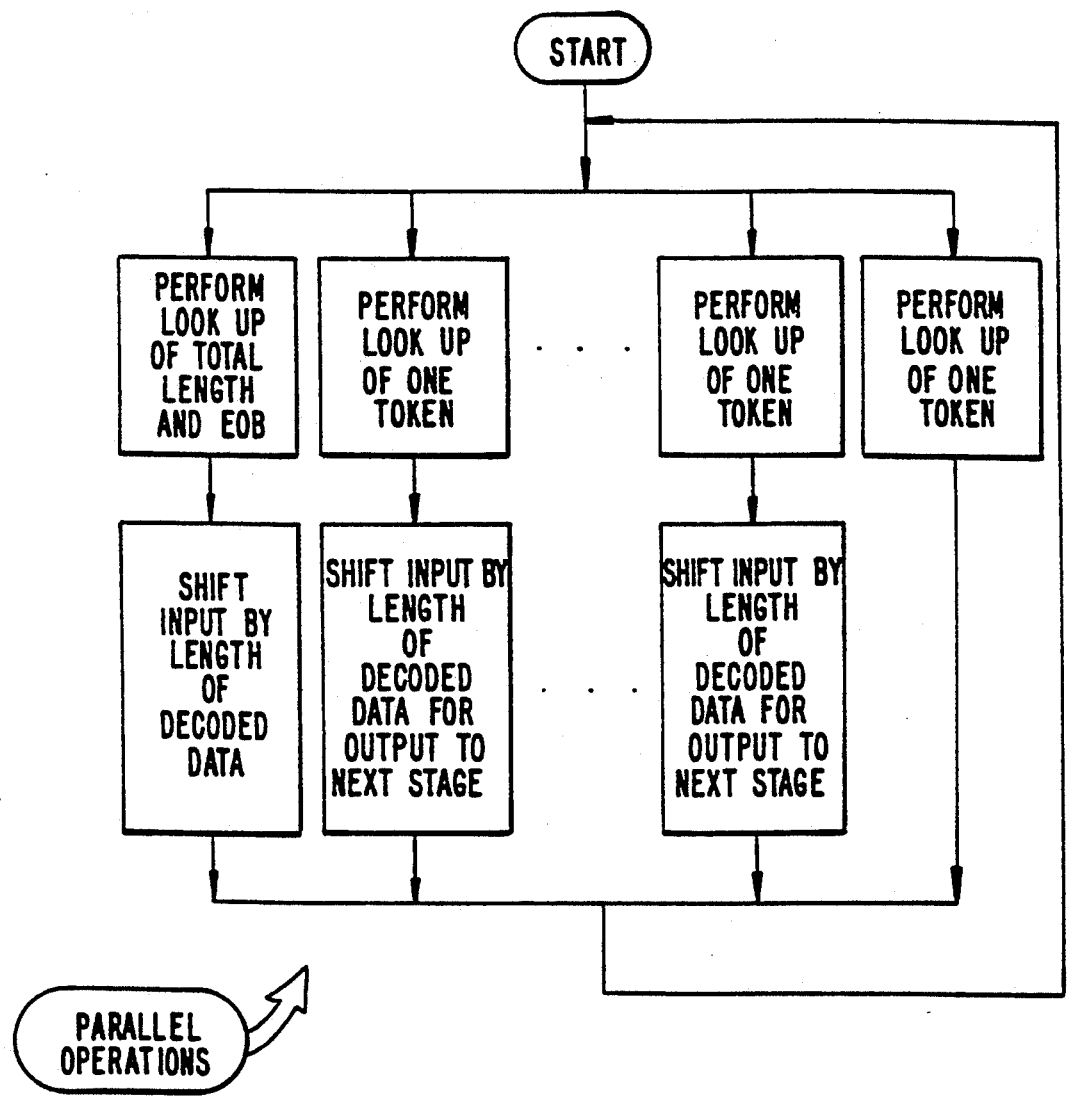
FIG. 11 is a flow chart of steps illustrating operations of different stages of the control memory decoder of FIG. 10A.

Operational steps for the control memory architecture are illustrated in FIG. 11. Many steps are performed in parallel. An initial look-up operation is performed with the memory unit 50 to obtain the total length of the decoded data in the bit shifter 24 (and any End of Block tokens for the JPEG example). The bit shifter 24 is then shifted by this amount and operations return to the initial step. These two steps are shown by the two operational blocks at the left of the drawing. In the meantime operation of the pipelined decoder stages is performed as represented by all the operational blocks to the right of the left blocks. A look-up step is initially performed by a look-up table unit 51-i. A token is generated, together with the length of the decoded data unit associated with the token. The shift register 53-i of that stage shifts the data by the length of the decoded data unit and operation returns to the look-up step for the next stage table unit 51-i+1. This pipelined operation continues until the last stage is reached, at which point a look-up operation is performed with the last look-up table unit 53-m, where m is the number of look-up table units 53.

Figure 7:
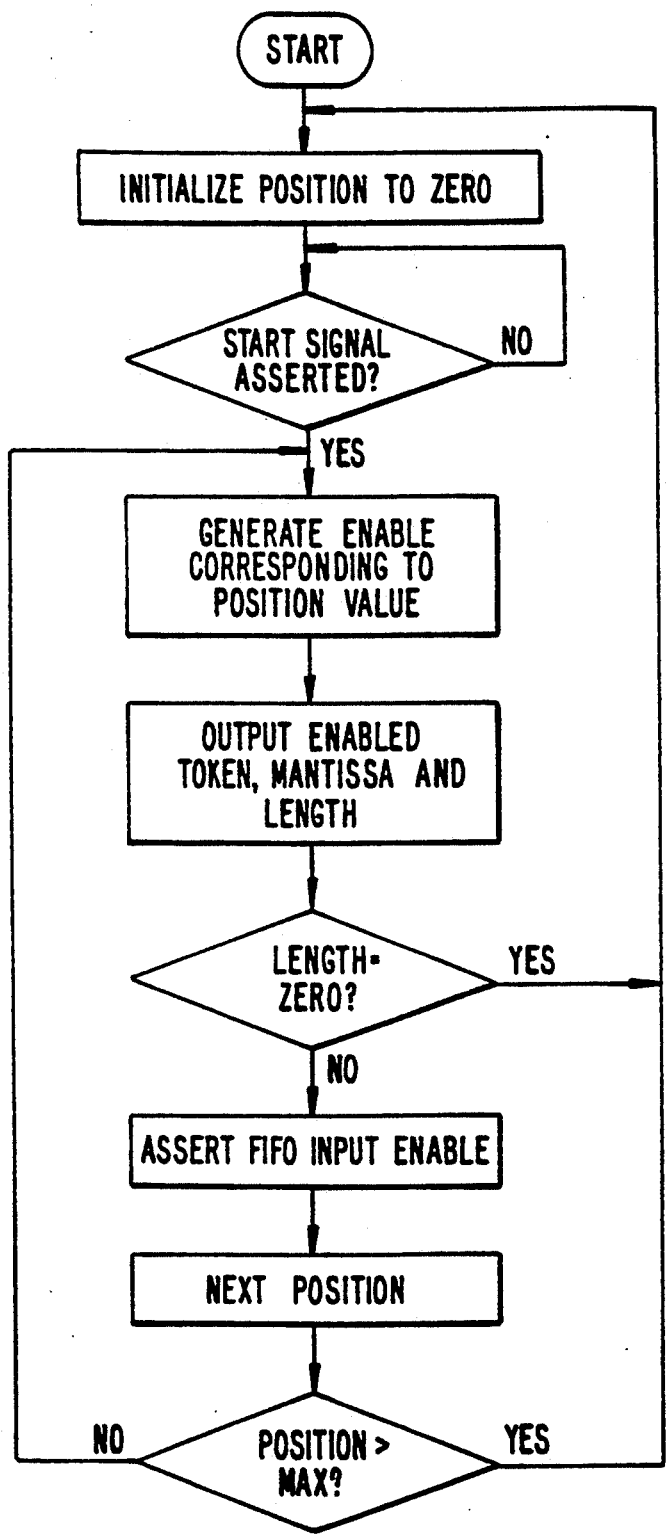
FIG. 7 is a flow chart of steps illustrating the control logic block of the circuitry shown in FIG. 4.

For the control memory architecture, the multiplexer control logic block 23 in FIG. 4 can be identical to that for the wide table decoder architecture described previously with the same operation described with respect to FIG. 7.

Figure 10B:
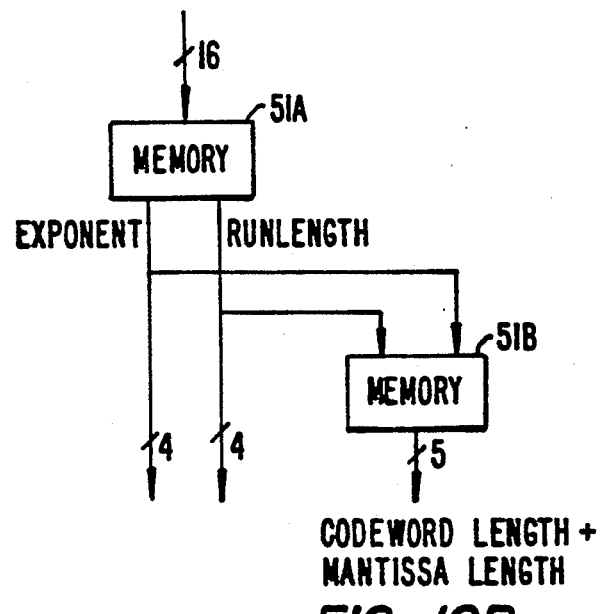
FIG. 10B is a configuration of a memory unit for a two-stage, look-up table for the pipelined decoding in FIG. 10A.

In this control memory architecture, unneeded speculative look-ups are avoided. Savings in memory space may be achieved by replacing each of the LUTs 51-i into two memory units. The LUTs 51-i generate a token, formed in the case of JPEG by exponent bits and run length bits, and the length of the total coded data unit. As illustrated in FIG. 10B, each LUT is divided into a first part 51A, which generates the token, and a second part 51B, which generates the length of the coded unit. A two-stage look-up operation is performed, but a substantial savings in memory space is obtained over a single LUT which generates both tokens and lengths.

Another observation is that in previous descriptions it was assumed that the LUTs generate both the token and the length of the coded data unit for speed. In these examples, it is convenient to use a length of zero to indicate an invalid token. If this length information is not available, invalid tokens can be recognized from the tokens themselves or other control bits.

A variation of this architecture has the first LUT unit 51-0 perform as a look-up table for DC codes only. If the LUT 51-0 is not addressed by a coefficient at the beginning of a coefficient block, the output from the LUT 51-0 is skipped. The rest of the pipeline stages handle AC codes, so that all the LUT units are smaller than the assumed minimum size.

Minimal Memory Unit Size

In the discussion of the various decoder architectures above, it is apparent that much of the integrated circuit space to implement the selected architecture is occupied by memory for look-up tables. The present invention also offers an organization of a memory unit so that amount of space occupied by each memory unit, either RAM or ROM, is minimized.

Figure 12A:
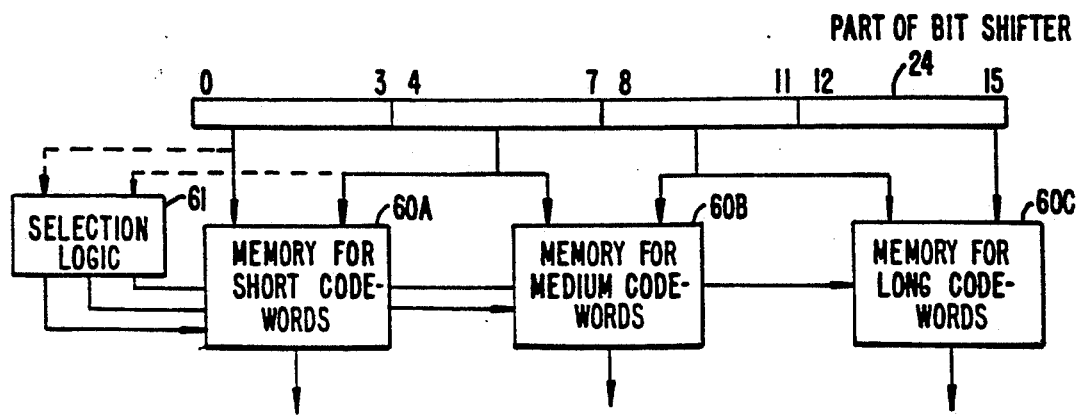
FIG. 12A illustrates a memory organization by which the total size of a memory used as a look-up table may be reduced.

This memory organization is shown in FIG. 12A. Instead of a single memory unit, such as described previously, each memory unit is divided into three separate memory units 60A, 60B and 60C. As described before, the total memory is connected to the individual cells of the shifter unit 24. In FIG. 12A, the first sixteen cells of the shifter 24 are connected to the memory so that the contents of eight cells address each of the memories 60A-60C in an overlapping manner. Cells 0-7 address the memory 60A, cells 4-11 address memory 60B and cells 8-15 address memory 60C.

Memory units 60A, 60B and 60C are look-up tables which respectively decode short, medium length, and long codewords. Combinatorial logic, shown by a block 61, enables one of the memories 60A-60C. If the first eight cells contain all logic "1"'s, the memory 60C for long codewords is enabled. On the other hand, if the first four cells contain all logic "1"'s and the next four cells don't, the memory 60B for medium codewords is enabled. Otherwise, the memory 60A for short codewords is enabled.

Figure 12B:
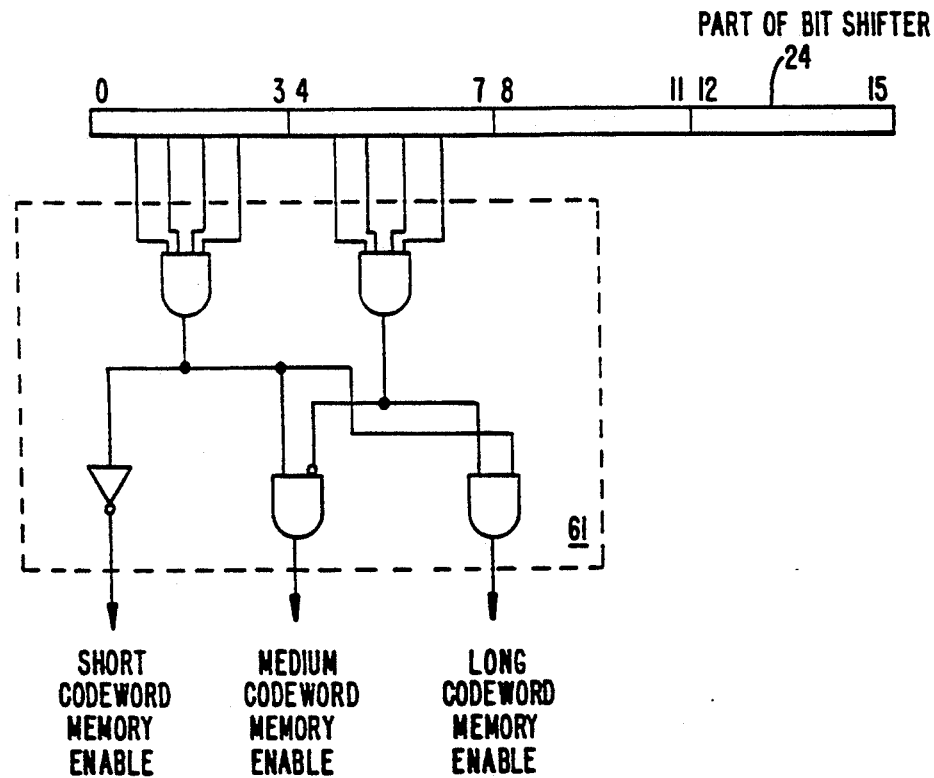
FIG. 12B shows the control logic for operating the memory organization of FIG. 12A.

The combinatorial logic performing this enabling function is shown in FIG. 12B. Five gates using two-level logic with a fan-in of 4 inputs are used. The combinatorial logic occupies a very small amount of space. Furthermore, the enabling function of selecting one of the memory units 60A-60C is performed very quickly. Since this enabling function is generated on data from the bitstream in the shifter 24, there is no requirement for a decode function to be performed before selection.

Figure 13:
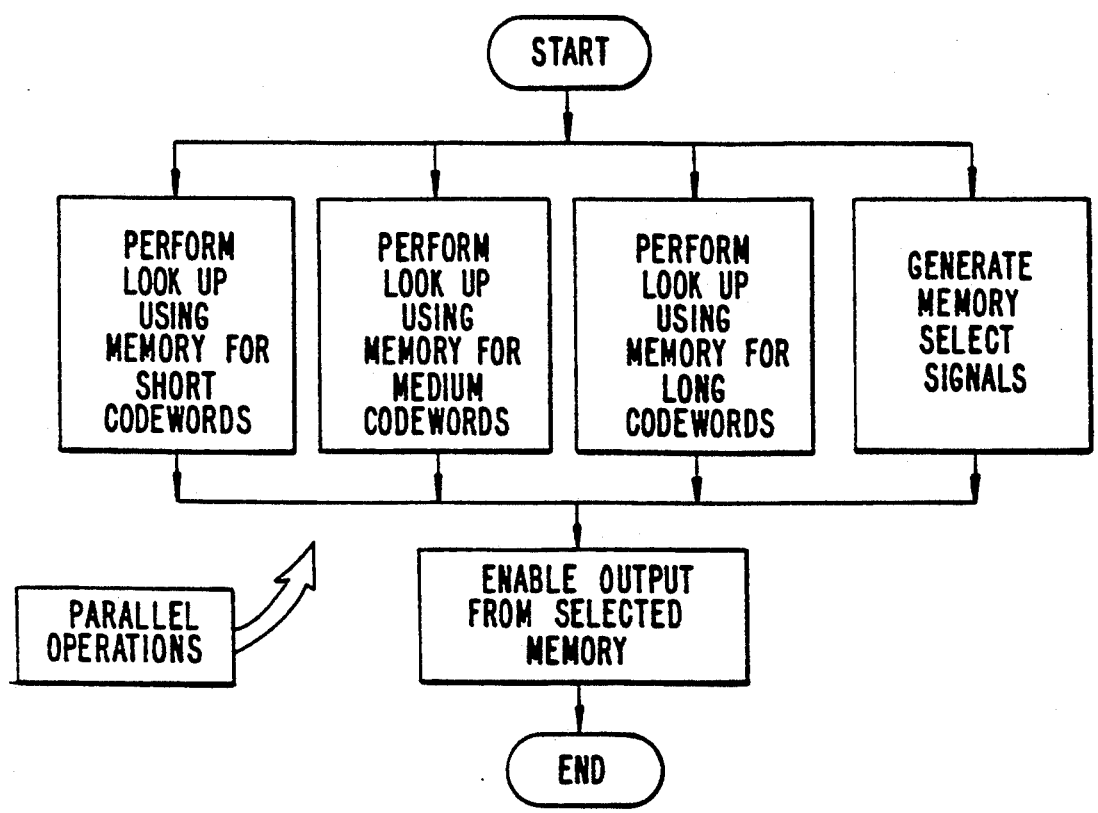
FIG. 13 is a flow chart of steps illustrating the operation of the memory organization of FIG. 12A.

Operations are illustrated in the flow chart of FIG. 13. Four operational steps are performed in parallel initially. Look-up operations are performed for the short codeword memory 60A, the medium codeword memory 60B and the long codeword memory 60C. Also control signals to select the appropriate memory are generated. Then the output from the selected memory is enabled.

This memory organization minimizes memory space. Only three eight-input memories are used, instead a single large memory. As a comparison, a sixteen-input memory for handling AC Huffman codes requires a memory of 852,000 bits. In the present case, only 9984 bits are used.

A possible disadvantage is that this memory organization cannot handle all possible Huffman codes. Codewords of 9 to 12 bits must start with at least four "1"'s and longer codewords must begin with at least eight "1"'s. But most of the codes which are specified by the canonical form used by JPEG standard can be processed. Any unique set of prefixes may be used, such as, eight or four "0"'s, for example.

This reduced memory organization is applicable for all the previous decoder architectures described above, except the wide table architecture. Of necessity, the memory unit in that architecture cannot be broken up; the memory must remain fully specified. However, the wide table look-up concept can be used to improve this invention. For example, the memory 60A for short codewords, may itself be a "wide" table, capable of generating more than one token simultaneously from several short codewords in cells 0-7. Since the memory 60A is now expected to generate several tokens at once, more cells, 8-11, may be connected to the memory 60A.

Finally, in the description above of particular decoder architectures, the features of the various decoder architectures were separated for purposes of illustration. Many of these features may be combined for a Huffman decoder which is particularly suited to an application or requirement. For example, much of the Huffman decoder implementations for JPEG should be applicable to many of the emerging standards for digital image processing, such as MPEG and HDTV. Thus the term "JPEG" used previously in the description of various implementations of the present invention should not be viewed strictly, but rather more broadly as "JPEG-like".

Thus, while the above is a complete description of the preferred embodiments of the invention, various alternatives, modifications and equivalents may be used. It should be evident that the present invention is equally applicable by making appropriate modifications to the embodiments described above. Therefore, the above description should not be taken as limiting the scope of the invention which is defined by the metes and bounds of the appended claims.

First list of 8 words

```
_. ↑
(_ '
↑ _
the
and
of
in
```

Second list of 64 words

```
_, the
_, and
_, ↑
_ ' _
_.
_. ↑  in
_. ↑  it
_. ↑  he
_. ↑  the
_ ) _
_ ). ↑
_ ),
_ }
_ ;
_ :
_ | ↑ _
_, _
_ ' s _
a
an
and the
after
also
are
at
, as
``` be
became
by
by the
but
century
city
first
from
for
his
has
he
in the

Appendix A it
its
is
new
of the
or
on
states
see
that
they
to
to the
which
war
was
with
were
{ ↑ -
↑ ↑ -
( -
,
us Third list of 512 words 0
000
1
1945
1980
19th
18th
10
15
12
_-), ↑ ↑
- - -
-.- ↑ -
, -, he -
  "

```
_.' ↑   hi,
_.  ↑   a
         ↑
_.|\\ ↑ _
_.|   ↑ _
_.'|   ↑
_."    ↑
_.   (_

_)' and
_),  ↑ ↑
_);  ↑ ↑
_);
_)i ↑ _
_),
_), ↑

_'s ↑
_"
_"  (_
_,  ↑
_@    _
_@  ↑
_:  $_
_:  ↑
_;  ↑
_%
``` about
against
agricultural
agriculture
age
although
along
all
among
ancient
another
any
approx
architecture
area
areas
around
army
art
as a
act
air
ad
b
base
based
battle
back bay
because
between
before
began
best
been
being
black
blood
blue
book
body
both
brought
brown
built
c
catholic
caused
capital
called
came
can
centuries
central
center
chief
china
chemical
chemicals
church
civil
cities
co
college
color
commercial
communist
common
congress
constitution
considered
control
country
court
coast
d
de
developed
development
defeated
death
discovered
disease
divided died
dynasty
during
day
e
earth
early
each
east
economic
economy
education
elected
elements
emperor
empire
energy
end
especially
established
events
f
family
famous
father
federal
field
fish
five
flowers
flows
foreign
form
formed
forms
force
forces
found
founded
four
food
french
free
from the
general
generally
government
governor
gold
god
great
green
group
groups
have
had
he was head
height
held
her
high
highest
history
him
however
house
human
i
important
inc
include
included
includes
including
income
industrial
industries
industry
independence
independent
indian
influence
influenced
international
into
island
islands
it is
iron
if
joined
king
kingdom
known
km
language
land
large
largest
late
later
labor
law
laws
lake
last
leader
leaves
length
legs
led
literature life
light
line
major
man
many
mass
made
main
may
member
members
mi
middle
minister
military
mountain
modern
movement
more
most
music
much
n
natural
nation
national
nations
native
name
named
no
north
northern
not
noted
now
number
near
ocean
off
official
of a
often
on the
only
one
order
own
out
other
old
oil
over
parliament
part
parts
party painter
per
period
people
peace
philosophy
poet
poetry
pop
popular
population
political
point
power
port
president
principal
prize
prime
product
products
produced
processing
published
public
plant
plants
r
region
religion
religious
republic
revolution
red
rights
river
rivers
rule
ruled
s
science
school
se
second
served
series
set
settled
senate
several
sea
seat
shaped
shall
short
she
since site
small
so
society
social
source
south
soviet
some
son
study
strong
steel
style
state
supreme
surface
sugar
such
system
species
same
sq
technology
territory
term
textiles
their
theory
there
these
then
them
through
throughout
three
those
than
this
took
town
trade
trading
treaty
tree
tropical
time
times
two
tail
university
united
union
until
under
usually use
used
up
v
various
west
western
weight
well
where
when
while
white
who
whose
william
with the
within
world
work
works
would
won
wrote
water
yellow
year
years
France
Roman
Rome
RAnge
Russia
Russian
Canada
Charles
Christian
Chinese
Louis
LOng
Pacific
Paris
Mexico
NW
Ne
Africa
African
America
American
Atlantic
Asia
India
Indians
Italian
Italy
II III
German
Germany
George
Greek
Spanish
Spain
SW
St
Britain
British
B C
Thomas
Egypt
England
English
Europe
European
Japan
Japanese
James
John
York
@ ↑ _
¨f
¨g
{
USSR
↑ _
Henry
. ↑
( ↑ _
" ↑ _
" ↑ _
W ¯
8
2
20
3
30
x
6
5
4
7

*File created:* 16-Aug-92 21:54:25 NIL

*Read Table:* INTERLISP

*Package:* INTERLISP

:: Copyright (c) 1992 by Xerox Corporation. All rights reserved.

```
(RPAQQ FULLTEXTCOMS
       ([VARS (ALPHANUMERICS (APPEND (FOR I FROM (CHARCODE A)
                                        TO
                                        (CHARCODE Z)
                                        COLLECT I)
                                    (FOR I FROM (CHARCODE a)
```

```
                                        TO
                                        (CHARCODE z)
                                        COLLECT I)
                                  (FOR I FROM (CHARCODE 0)
                                        TO
                                        (CHARCODE 9)
                                        COLLECT I]
    (FNS COMPRESS-TEXT)
    (FNS TOKENIZE MAKECHARTABLE READUNTILCHARTABLE)
    (FNS RANKLIST)
    (FNS MAKE-WNMAPPERS)
    (FNS ENCODE-TEXT ENCODE-STRING WRITE-STRING-ENCODING)
    (FNS DECOMPRESS-TEXT PRINT-STRING READ-TOKEN)
    (FNS SEARCHTEXT)
    (MACROS BOUTBITSCONTEXT BOUTBITS)
    (MACROS BINBITSCONTEXT BINBITS GETBINBITSSTATE SETBINBITSSTATE)))

(RPAQ ALPHANUMERICS
      (APPEND (FOR I FROM (CHARCODE A)
                   TO
                   (CHARCODE Z)
                   COLLECT I)
              (FOR I FROM (CHARCODE a)
                   TO
                   (CHARCODE z)
                   COLLECT I)
              (FOR I FROM (CHARCODE 0)
                   TO
                   (CHARCODE 9)
                   COLLECT I)))

(DEFINEQ (COMPRESS-TEXT
  [LAMBDA (TEXTFILE MAPPERFILENAME COMPRESSEDFILENAME DIGITSPEC)
    (CL:UNLESS DIGITSPEC
        (SETQ DIGITSPEC '(4 4 4 4 4 4)))
    (RESETLST
        (LET (WNMAPPERFILE (DEFAULTSEPR '% )
                (CANCELDEFAULTSEPRCHAR '+)
                (CASESHIFT '*)
                (WORDCHARTABLE (MAKECHARTABLE ALPHANUMERICS 1)))
            (SETQ WNMAPPERFILE (MAKE-WNMAPPERS TEXTFILE MAPPERFILENAME DIGITSPEC DEFAUL . PR
                                  CANCELDEFAULTSEPRCHAR CASESHIFT WORDCHARTABLE))
            (ENCODE-TEXT TEXTFILE WNMAPPERFILE COMPRESSEDFILENAME DIGITSPEC DEFAULTSEPR
                CANCELDEFAULTSEPRCHAR CASESHIFT WORDCHARTABLE)))])
)

(DEFINEQ (TOKENIZE
  [LAMBDA (TEXTFILE DEFAULTSEPR WORDCHARTABLE CANCELSEPRCHAR CASESHIFT OUTPUTFN)
    ;; TEXT is divided into an alternative sequence of word (as defined in WORDBITTABLE) and punctuation
    ;; strings, with punctuation strings beginning with CANCELSEPRCHAR if they are not preceded by a
    ;; DEFAULTSEPR and ending with CANCELSEPRCHAR if they are not followed by a DEFAULTSEPR.  CASESHIFT
    ;; is used to indicate initial-caps and all upper-casing.  OUTPUTFN is applied to resulting token
    ;; strings.  WORDCHARTABLE is an array indexed by character codes whose values are 1 for every
    ;; alphanumeric word character and 0 for punctuation and other non-word characters.
    (RESETLST
        (BIND WORDSTRING PUNCTSTRING TEXTSTREAM UCASE (DEFAULTSEPRLENGTH ← (NCHARS DEFAULTSEPR))
          FIRST [RESETSAVE (SETQ TEXTSTREAM (OPENSTREAM TEXTFILE 'INPUT))
                      '(PROGN (CLOSEF OLDVALUE]
          DO (SETQ PUNCTSTRING (READUNTILCHARTABLE TEXTSTREAM WORDCHARTABLE 1))
             (SETQ WORDSTRING (READUNTILCHARTABLE TEXTSTREAM WORDCHARTABLE 0))
             (IF (AND (EQ 0 (NCHARS PUNCTSTRING))
                      (EQ 0 (NCHARS WORDSTRING)))
                 THEN                                    ; End of file
                      (RETURN))                          ; UCASE records case shift string
             (SETQ UCASE (IF (U-CASEP WORDSTRING)
                             THEN (SETQ WORDSTRING (L-CASE WORDSTRING))
                                  (CONCAT CASESHIFT CASESHIFT)
                             ELSEIF (AND (U-CASEP (NTHCHAR WORDSTRING 1))
                                         (L-CASEP (SUBSTRING WORDSTRING 2 -1)))
                             THEN (SETQ WORDSTRING (L-CASE WORDSTRING))
                                  CASESHIFT
                             ELSE ""))
             (SETQ PUNCTSTRING (IF (STRPOS DEFAULTSEPR PUNCTSTRING 1 NIL T)
                                   THEN
                                        ;; Punct begins with sepr, strip it off
                                        (OR (SUBSTRING PUNCTSTRING (ADD1 DEFAULTSEPRLENGTH)
                                                -1)
                                            "")
                                   ELSE (CONCAT CANCELSEPRCHAR PUNCTSTRING)))
             (SETQ PUNCTSTRING (IF (EQ 0 (NCHARS PUNCTSTRING))
                                   THEN (IF (NEQ 0 (NCHARS UCASE))
                                            THEN              ; Punct was originally just a sepr
                                                 (CONCAT UCASE CANCELSEPRCHAR)
```

```
                                             ELSE "")
                                    ELSEIF (STRPOS DEFAULTSEPR PUNCTSTRING NIL NIL NIL NIL NIL T)
                                       THEN                    : Punct followed by defaultsepr
                                            (CONCAT (OR (SUBSTRING PUNCTSTRING DEFAULTSEPRLENGTH
                                                                   (- -1 DEFAULTSEPRLENGTH))
                                                        "")
                                                    UCASE)
                                    ELSE (CONCAT PUNCTSTRING UCASE CANCELSEPRCHAR)))
                   (IF (NEQ 0 (NCHARS PUNCTSTRING))
                       THEN (APPLY* OUTPUTFN PUNCTSTRING))
                   (APPLY* OUTPUTFN WORDSTRING)))])

(MAKECHARTABLE
  [LAMBDA (CHARS VAL)

:: Makes an array with  values corresponding to characters in CHARS set to VAL. all others elements
    :: set to 0

(LET ((ARRAY (CL:MAKE-ARRAY 256 :INITIAL-ELEMENT 0)))
         (FOR C IN CHARS DO (CL:SETF (CL:SVREF ARRAY (IF (LITATOM C)
                                                        THEN (CHCON1 C)
                                                        ELSE C))
                                     VAL))
         ARRAY])

(READUNTILCHARTABLE
  [LAMBDA (FILE CHARTABLE VAL)

:: Read characters from file until either the end of file is reached (PEEKC returns NIL) or until the
    :: element in CHARTABLE corresponding to the next character is  equal to VAL.  The characters read
    :: (not including the one with VAL) are assembled into the returned string.

(CONCATLIST (BIND CHAR WHILE (SETQ CHAR (PEEKCCODE FILE T)) UNTIL (EQ VAL (CL:SVREF CHARTABLE CHAR))
                   COLLECT

:: Re-read CHAR as a character, not a code, for concatlist (READC FILE])

)

(DEFINEQ (RANKLIST
  [LAMBDA (TEXTFILE DEFAULTSEPR WORDCHARTABLE CANCELSEPRCHAR CASESHIFT)

:: Returns a list in decreasing frequency order of all the token-types found in TEXTFILE.  Value is a
    :: list of (string . frequency) pairs.

(LET ((RANKARRAY (CL:MAKE-ARRAY 256 :INITIAL-ELEMENT NIL)))
                                                   ; Build an alist of (string freq) pairs in
                                                   ; arrays indexed by first 2 characters.  Could
                                                   ; index by 3 or more characters for increased
                                                   ; speed at cost of more space.
         (DECLARE (SPECVARS RANKARRAY))
         [TOKENIZE TEXTFILE DEFAULTSEPR WORDCHARTABLE CANCELSEPRCHAR CASESHIFT
                (FUNCTION (LAMBDA (STRING)
                        (LET* ((FIRSTCHAR (NTHCHARCODE STRING 1))
                               (SECONDCHAR (NTHCHARCODE STRING 2))
                               SECELT)

:: SECELTs are of the form (ARRAY FREQ) where FREQ is the frequency of
                              :: the singleton FIRSTCHAR

[SETQ SECELT (OR (CL:SVREF RANKARRAY FIRSTCHAR)
                                               (CL:SETF (CL:SVREF RANKARRAY FIRSTCHAR)
                                                        (CONS (CL:MAKE-ARRAY 256 :INITIAL-ELEMENT NIL)
                                                              0]
                              (IF SECONDCHAR
                                  THEN            ; Build up alist in second-array cell
                                       (ADD [CDR (OR (SASSOC STRING (CL:SVREF (CAR SECELT)
                                                                              SECONDCHAR))
                                                     (CAR (CL:PUSH (CONS STRING 0)
                                                                   (CL:SVREF (CAR SECELT)
                                                                             SECONDCHAR]
                                            1)
                                  ELSE            ; FIRSTCHAR singleton
                                       (ADD (CDR SECELT)
                                            1]

:: Pull the results out of the array and arrange them in decreasing frequency order.  Make sure
         :: that the DEFAULTSEPR is included, so that it eventually gets assigned a number.

(SORT [CONS (CONS DEFAULTSEPR 0)
                     (FOR FIRSTCHAR SECELT FROM 0 TO 255 WHEN (SETQ SECELT (CL:SVREF RANKARRAY
                                                                                    FIRSTCHAR))
                         JOIN (NCONC [IF (NEQ 0 (CDR SECELT))
                                         THEN (CONS (CONS (MKSTRING (CHARACTER FIRSTCHAR))
                                                          (CDR SECELT]
                                     (FOR SECONDCHAR FROM 0 TO 255 JOIN (CL:SVREF (CAR SECELT)
                                                                                  SECONDCHAR]
               (FUNCTION (LAMBDA (A B)
                       (IGEQ (CDR A)
                             (CDR B])
```

```
)
(DEFINEQ (MAKE-WNMAPPERS
  [LAMBDA (TEXTFILE MAPPERFILENAME DIGITSPEC DEFAULTSEPR CANCELDEFAULTSEPRCHAR CASESHIFT WORDCHARTABLE)
    ;; TEXTFILE is the textfile to be compressed. MAPPERFILENAME is the name of the word-number mapper
    ;; file to be produced. DIGITSPEC is a list of the digit sizes to be used for the encoding (e.g. (4 4
    ;; 4 4), (8 8 8), (4 8 8) etc.
    (DECLARE (GLOBALVARS ALPHANUMERICS))
    (LET [FSMS RANKS (DEFAULTSEPR '% )
               (CANCELDEFAULTSEPRCHAR '~)
               (CASESHIFT '↑)
               (WORDCHARTABLE (MAKECHARTABLE ALPHANUMERICS 1))
               (WNMSIZE (FOR SPEC (SHIFT ← 0) IN DIGITSPEC COLLECT
                                                ;; SUB1 because one bit is for
                                                ;; continuation
                                               (LLSH 1 (SETQ SHIFT (IPLUS SHIFT
                                                                          (SUB1 SPEC]
      (SETQ RANKS (RANKLIST TEXTFILE DEFAULTSEPR WORDCHARTABLE CANCELDEFAULTSEPRCHAR CASESHIFT))
      ;; Now partition the strings in RANKS into subsets of the appropriate size for the different
      ;; word-number mappers.
      [SETQ FSMS (FOR SPEC IN WNMSIZE WHILE RANKS
                      COLLECT (FOR I (FSM ← (NULLFSM)) FROM 1 TO SPEC WHILE RANKS
                                   DO (ADDSTRINGTOFSM (CAR (POP RANKS))
                                                      FSM)
                                   FINALLY (RETURN FSM]
      ;; Convert the fsms to compact word-number mappers stored on MAPPERFILENAME for future use.
      (WRITE-WORDNUMBER-MAPPERS FSMS MAPPERFILENAME])
)

(DEFINEQ (ENCODE-TEXT
  [LAMBDA (TEXTFILE MAPPERFILENAME COMPRESSEDFILENAME DIGITSPEC DEFAULTSEPR CANCELSEPRCHAR CASESHIFT
                    WORDCHARTABLE)
    (DECLARE (SPECVARS DIGITSPEC))
    (RESETLST
      (LET (COMPRESSEDSTREAM (WNMAPPERS (READ-WORDNUMBER-MAPPERS MAPPERFILENAME)))
           (DECLARE (SPECVARS COMPRESSEDSTREAM WORDMAPPERS))
        ;; Truncate digit spec to the actual maximum needed
        (SETQ DIGITSPEC (FOR D IN DIGITSPEC AS I IN WNMAPPERS COLLECT D))
        [RESETSAVE [SETQ COMPRESSEDSTREAM (OPENSTREAM COMPRESSEDFILENAME 'OUTPUT 'NEW
                                                      '((TYPE BINARY]
                    '(PROGN (CLOSEF? OLDVALUE)
                            (AND RESETSTATE (DELFILE OLDVALUE]
        ;; BOUTBITSCONTEXT keeps track of stream state so that partial bytes are properly written
        ;; (via BOUTBITS in WRITE-STRING-ENCODING)
        (BOUTBITSCONTEXT COMPRESSEDSTREAM (TOKENIZE TEXTFILE DEFAULTSEPR WORDCHARTABLE
                                                    CANCELSEPRCHAR CASESHIFT (FUNCTION
                                                                               WRITE-STRING-ENCODING)))
        (FULLNAME COMPRESSEDSTREAM)))])

(ENCODE-STRING
  [LAMBDA (STRING DIGITSPEC WNMAPPERS)
    ;; Returns the encoding of string as a list of pairs of the form (digitval digitwidth), where
    ;; digitval has the continuation bit orred in and is supposed to occupy a field of digitwidth bits.
    (LET [(WNPAIR (FOR W NUM IN WNMAPPERS AS I FROM 0 WHEN (SETQ NUM (GetNumberForWord STRING W))
                       DO (RETURN (LIST NUM I]
      (IF WNPAIR
          THEN (FOR D CONTIN (NUM ← (CAR WNPAIR))
                    (LEFTPOS ← (FOR I FROM 0 TO (CADR WNPAIR) AS D IN DIGITSPEC
                                    SUM (SUB1 D)))
                    IN DIGITSPEC AS I FROM 0 TO (CADR WNPAIR)
                    COLLECT (SETQ CONTIN (IF (EQ I (CADR WNPAIR))
                                             THEN 0
                                             ELSE 1))
                            (SETQ LEFTPOS (- LEFTPOS (SUB1 D)))
                            (LIST (LOGOR (LLSH CONTIN (SUB1 D))
                                         (LOGAND (MASK.1'S 0 (SUB1 D))
                                                 (LRSH NUM LEFTPOS)))
                                  D])

(WRITE-STRING-ENCODING
  [LAMBDA (STRING)
    (DECLARE (USEDFREE DIGITSPEC WNMAPPERS COMPRESSEDSTREAM))
    (FOR E IN (ENCODE-STRING STRING DIGITSPEC WNMAPPERS) DO (BOUTBITS COMPRESSEDSTREAM (CAR E)
                                                                      (CADR E])
```

```
)
(DEFINEQ (DECOMPRESS-TEXT
  [LAMBDA (COMPRESSEDFILE WNMAPPERFILES DECOMPRESSEDFILE DIGITSPEC)
    ;; Decompresses the tokens encoded in COMPRESSEDFILE, writing the results on DECOMPRESSEDFILE.
    (RESETLST
        (LET (DECSTREAM COMPSTREAM (WNMAPPERS (READ-WORDNUMBER-MAPPERS WNMAPPERFILES)))
                (DEFAULTSEPR '% )
                (CANCELDEFAULTSEPRCHAR '←)
                (CASESHIFT '↑))
            [RESETSAVE [SETQ COMPSTREAM (OPENSTREAM COMPRESSEDFILE 'INPUT 'OLD '((TYPE BINARY]
                       '(PROGN (CLOSEF OLDVALUE]
            [RESETSAVE [SETQ DECSTREAM (OPENSTREAM DECOMPRESSEDFILE 'OUTPUT 'NEW '((TYPE TEXT]
                       '(PROGN (CLOSEF OLDVALUE)
                               (AND RESETSTATE (DELFILE OLDVALUE]
            [BINBITSCONTEXT (BIND STRING WHATNEXT (LASTSTRING ← "") UNTIL (EOFP COMPSTREAM)
                     DO                                ; Compute the next token number and its
                                                       ; corresponding word-number mapper number
                         (SETQ WHATNEXT (PRINT-STRING (READ-TOKEN WNMAPPERS DIGITSPEC
                                                                  COMPSTREAM)
                                                      WHATNEXT DEFAULTSEPR CANCELDEFAULTSEPRCHAR
                                                      CASESHIFT DECSTREAM]
            (FULLNAME DECSTREAM))])

(PRINT-STRING
  [LAMBDA (STRING WHATNEXT DEFAULTSEPR CANCELSEPR CASESHIFT DESTINATION)
    ;; This is a simple string-printer, except that it puts a DEFAULTSEPR before the string if WHATNEXT
    ;; contains SEPR and it doesn't begin with CANCELSEPR. Alls capitalizes or upper-cases if WHATNEXT
    ;; contains INITIALCAP or ALLCAPS. It returns the WHATNEXT for the next word depending on whether
    ;; this word ends with CANCELSEPR and whether it contains CASESHIFT's to affect the next word.
    (LET (NEXT FIRSTCHAR LASTCHAR)
        (SETQ FIRSTCHAR (IF (EQ CANCELSEPR (NTHCHAR STRING 1))
                            THEN 2
                          ELSE (IF (MEMB 'SEPR WHATNEXT)
                                   THEN (PRIN3 DEFAULTSEPR DESTINATION))
                               1))
        (SETQ LASTCHAR (IF (EQ CANCELSEPR (NTHCHAR STRING -1))
                           THEN (SETQ NEXT NIL)
                                (SUB1 (NCHARS STRING))
                         ELSE (SETQ NEXT '(SEPR))
                              (NCHARS STRING)))
        (IF (NEQ CASESHIFT (NTHCHAR STRING LASTCHAR))
          ELSEIF (EQ CASESHIFT (NTHCHAR STRING (SUB1 LASTCHAR)))
             THEN (PUSH NEXT 'ALLCAPS)
                  (SETQ LASTCHAR (- LASTCHAR 2))
          ELSE (PUSH NEXT 'INITIALCAP)
               (SETQ LASTCHAR (- LASTCHAR 1)))
        (IF (MEMB 'ALLCAPS WHATNEXT)
            THEN (SETQ STRING (U-CASE STRING))
          ELSEIF (MEMB 'INITIALCAP WHATNEXT)
            THEN (SETQ STRING (L-CASE STRING T)))
        (FOR I FROM FIRSTCHAR TO LASTCHAR DO (PRINTCCODE (NTHCHARCODE STRING I)
                                                         DESTINATION))
        NEXT])

(READ-TOKEN
  [LAMBDA (WNMAPPERS DIGITSPEC COMPSTREAM)
    (FOR D NEXT (TOKEN ← 0)
         (CONTIN ← T)
         (WNMAPNUM ← 0) IN DIGITSPEC WHILE CONTIN DO (ADD WNMAPNUM 1)
                                                    (SETQ NEXT (BINBITS COMPSTREAM D))
                                                    [SETQ CONTIN (NEQ 0 (LOGAND NEXT
                                                                                (LLSH 1 (SUB1 D]
                                                    [SETQ TOKEN (LOGOR (LLSH TOKEN (SUB1 D))
                                                                       (LOGAND NEXT (MASK.1'S
                                                                                     0
                                                                                     (SUB1 D]
         FINALLY (RETURN (GetWordForNumber TOKEN (CAR (NTH WNMAPPERS WNMAPNUM])
)

(DEFINEQ (SEARCHTEXT
  [LAMBDA (WORD COMPRESSEDSTREAM WNMAPPERS DIGITSPEC)
    ;; Scans forward for WORD in COMPRESSEDSTREAM, starting from current COMPRESSEDSTREAM position, which
    ;; is assumed to be at the beginning of a token. Returns the binbitsstate of the beginning of the
    ;; match if it finds one, leaving stream positioned at the beginning of that token. Returns NIL on
    ;; failure, leaving stream position unchanged. This is a very simple substring searching loop,
    ;; converting to Knuth-Morris-Pratt or Boyer-Moore would presumably improve performance. Cannot be
    ;; used to search for punctuation strings, since they have been modified in unknown ways for
    ;; separator processing and case shifting. BINBITS machinery is used for processors that can only
    ;; read a byte at a time when nibbles (or smaller) digits are specified--should be run under
    ;; BINBITSCONTEXT.
```

```
            (IF [OR (U-CASEP WORD)
                    (AND (U-CASEP (NTHCHAR WORD 1))
                         (L-CASEP (SUBSTRING WORD 2 -1]
                 THEN
                    ;; All upper-case and initial-caps are encoded as lower case, since shifts are attached to
                    ;; preceding punctuation
                    (SETQ WORD (L-CASE WORD)))
            (LET ((ENC (ENCODE-STRING WORD DIGITSPEC WNMAPPERS)))
                 (IF ENC
                     THEN (BIND BINBITSSTATE (STARTBINBITSSTATE ← (GETBINBITSSTATE COMPRESSEDSTREAM))
                               DO (SETQ BINBITSSTATE (GETBINBITSSTATE COMPRESSEDSTREAM))
                               (IF [FOR E IN ENC ALWAYS (EQ (CAR E)
                                                            (BINBITS COMPRESSEDSTREAM (CADR E]
                                   THEN
                                        ;; Found a match
                                        (SETBINBITSSTATE COMPRESSEDSTREAM BINBITSSTATE)
                                        (RETURN BINBITSSTATE)
                                   ELSE (SETBINBITSSTATE COMPRESSEDSTREAM BINBITSSTATE)

;; Skip a complete token by checking continuation bits. We wouldn't have
                                        ;; to bother with token-alignment if digits were all of the same size
                                        ;; (e.g. (4 4 4) but not (4 8 4))
                                        [FOR D IN DIGITSPEC UNTIL (EQ 0 (LOGAND (BINBITS COMPRESSEDSTREAM D)
                                                                                (LLSH 1 (SUB1 D]
                                        (IF (EOFP COMPRESSEDSTREAM)
                                            THEN (SETBINBITSSTATE COMPRESSEDSTREAM STARTBINBITSSTATE)
                                                 (RETURN NIL])
)

(DECLARE%: EVAL@COMPILE (PUTPROPS BOUTBITSCONTEXT MACRO ((STREAM . FORMS)    ; Open STREAM needed so can cleanup the last
                                                     ; byte
                                (LET ((NEMPTYBITSINBYTE 8)
                                      (BITSINBYTE 0))
                                     (DECLARE (SPECVARS NEMPTYBITSINBYTE BITSINBYTE))
                                     (PROGN . FORMS)
                                     (OR (EQ NEMPTYBITSINBYTE 8)
                                         (BOUT STREAM BITSINBYTE))
                                     STREAM)))

(PUTPROPS BOUTBITS MACRO (OPENLAMBDA (STREAM BITS NBITS)
                          (BIND (BITSREMAINING ← BITS)
                                (NBITSREMAINING ← NBITS)
                           DO (COND
                                ((IGREATERP NEMPTYBITSINBYTE NBITSREMAINING)
                                                  ; BITSREMAINING is less than 256
                                 (SETQ NEMPTYBITSINBYTE (IDIFFERENCE NEMPTYBITSINBYTE
                                                                     NBITSREMAINING))
                                 (SETQ BITSINBYTE (CL:LOGIOR BITSINBYTE (CL:ASH BITSREMAINING
                                                                                NEMPTYBITSINBYTE)))
                                 (RETURN)))       ; BITSREMAINING may be a bignum
                               [BOUT STREAM (CL:LOGIOR BITSINBYTE (CL:ASH BITSREMAINING
                                                                          (IMINUS (SETQ NBITSREMAINING
                                                                                        (IDIFFERENCE
                                                                                         NBITSREMAINING
                                                                                         NEMPTYBITSINBYTE
                                                                                         ]
                               (SETQ BITSREMAINING (LOGAND BITSREMAINING (- (CL:ASH 1 NBITSREMAINING)
                                                                            1)))
                               (SETQ BITSINBYTE 0)
                               (SETQ NEMPTYBITSINBYTE 8))
                          BITS))
)

(DECLARE%: EVAL@COMPILE (PUTPROPS BINBITSCONTEXT MACRO ((FIRST . REST)
                                (LET ((UNREADBITSINBYTE 0)
                                      (BITSFROMBYTE 0))
                                     (DECLARE (SPECVARS UNREADBITSINBYTE BITSFROMBYTE))
                                     (PROGN FIRST . REST))))

(PUTPROPS BINBITS MACRO [OPENLAMBDA (STREAM NBITS)
                         (BIND (BITSREAD ← 0)
                               (NBITSTOREAD ← NBITS) DO (COND
                                                           ((IGEQ UNREADBITSINBYTE NBITSTOREAD)
                                                            ; Don't need to read next byte
                                                            (SETQ UNREADBITSINBYTE (IDIFFERENCE
                                                                                     UNREADBITSINBYTE
                                                                                     NBITSTOREAD))
                                                            (SETQ BITSREAD (CL:LOGIOR (CL:ASH BITSREAD
                                                                                               NBITSTOREAD
                                                                                               )
                                                                                       (LRSH BITSFROMBYTE
                                                                                             UNREADBITSINBYTE
```

```
                                           )))
                    (SETQ BITSFROMBYTE (LOGAND BITSFROMBYTE
                                              (MASK.1'S 0
                                                 UNREADBITSINBYTE
                                                 )))
                    (RETURN BITSREAD)))
                ;; Have to read more. first take the remaining
                ;; bits from last byte
                (SETQ BITSREAD (CL:LOGIOR (CL:ASH BITSREAD
                                                 UNREADBITSINBYTE
                                                 )
                                          BITSFROMBYTE))
                (SETQ NBITSTOREAD (- NBITSTOREAD
                                     UNREADBITSINBYTE))
                (SETQ UNREADBITSINBYTE 8)
                (SETQ BITSFROMBYTE (BIN STREAM])

(PUTPROPS GETBINBITSSTATE MACRO ((STREAM)
                ;; Returns current bin-bits state. which can be restored by
                ;; SETBINBITSSTATE. both of which must be executed under a
                ;; BINBITSCONTEXT
                (LIST (GETFILEPTR STREAM)
                      UNREADBITSINBYTE BITSFROMBYTE)))

(PUTPROPS SETBINBITSSTATE MACRO ((STREAM STATE)
                ;; Makes the data in STATE become the current bin-bits state when
                ;; executed inside a BINBITSCONTEXT.
                (SETFILEPTR STREAM (CAR STATE))
                (SETQ UNREADBITSINBYTE (CADR STATE))
                (SETQ BITSFROMBYTE (CADDR STATE))))
)

(PUTPROPS FULLTEXT COPYRIGHT ("Xerox Corporation" 1992))
```

What is claimed is:

1. A decoder for units of Huffman-coded data, each unit having codewords, said decoder having an input terminal receiving said data and comprising
 a bit shifter unit, connected to said input terminal, having a plurality of cells, each of cell holding a bit of said received data; and
 a memory unit having a plurality of input address terminals and output terminals, each of said address terminals connected to one of said bit shifter cells, said memory unit generating tokens at said output terminals simultaneously from each complete codeword at said input address terminals, said memory unit generating control signals corresponding to the total length of said coded data units having complete codewords at said input address terminals so that said coded data may be shifted through said bit shifter unit, wherein at least tokens are stored at addresses of said memory unit, and wherein at least one address of said memory unit stores more than one token at an address, said address being a concatenation of more than one codeword;
 whereby said coded data units are decoded simultaneously and said bit shifter unit is ready for a next decoding cycle.

2. A decoder as in claim 1 wherein said memory unit is at least as many input terminals as the largest codeword in said Huffman-coded data.

3. A decoder as in claim 2 wherein said memory unit is capable of generating tokens for all codewords at only a subset of said input address terminals whereby size of said memory unit is reduced.

4. A decoder as in claim 3 wherein said memory unit is capable of generating tokens for all codewords only for a first positioned codeword in said bit shifter unit.

5. A decoder as in claim 4 wherein said memory unit is capable of generating tokens for a subset of codewords at locations other than said first positioned codeword in said bit shifter unit, said subset of codewords being the most frequently occurring.

6. A decoder receiving units of Huffman-coded data, each unit having a codeword, in the form of bits, said decoder comprising
 a bit shifter unit holding said bits of received data in order or reception;
 a plurality of look-up table units connected to said bit shifter unit such that each of said look-up table units simultaneously generates tokens responsive to a plurality of bits staggered in order of reception; and logic means, connected to said look-up table units, for determining which of said look-up table units has generated valid tokens;

whereby said decoder decodes in one cycle one or more units of received data having bits of a complete codeword causing a look-up table unit to generate a token.

7. The decoder as in claim 6 wherein said logic means further determines the total amount of bits to be shifted by said bit shifter unit for a next decoding cycle.

8. The decoder as in claim 6 wherein a connection of each look-up table unit to said bit shifter unit is staggered by one bit.

9. The decoder as in claim 6 wherein a connection of each look-up table unit to said bit shifter unit is staggered by amounts corresponding to the most likely occurring combinations of coded data units.

10. The decoder as in claim 6 wherein said units of Huffman-coded data correspond to a plurality of Huffman codes and said look-up table units generate a plurality of tokens in parallel, one token for each Huffman code.

11. The decoder as in claim 10 wherein said plurality of look-up table units generate four tokens in parallel, one token each for AC Luminance, DC Luminance, AC Chrominance and DC Chrominance Huffman codes.

12. The decoder as in claim 6 wherein said plurality of look-up table units comprises a first unit connected to an initial position of said bit shifter unit and at least one second unit connected to said bit shifter unit offset from said initial position, said first unit generating tokens for all possible codewords, and said second unit generating tokens for a subset of all possible codewords.

13. The decoder as in claim 6 wherein the total amount of bits to be shifted by said bit shifter unit for a next decoding cycle is fixed.

14. The decoder as in claim 13 wherein said units of Huffman-coded data correspond to a plurality of Huffman codes and said look-up table units generate a plurality of tokens in parallel, one token for each Huffman code.

15. The decoder as in claim 14 wherein said plurality of look-up table units generate four tokens in parallel, one token each for AC Luminance, DC Luminance, AC Chrominance and DC Chrominance Huffman codes.

16. The decoder as in claim 15 wherein a connection of each look-up table unit to said bit shifter unit is staggered by one bit.

17. The decoder as in claim 13 wherein said plurality of look-up table units comprises a first unit connected to an initial position of said bit shifter unit and at least one second unit connected to said bit shifter unit offset from said initial position, said first unit generating tokens for all possible codewords, and said second unit generating tokens for a subset of all possible codewords.

18. The decoder of claim 17 wherein responsive to an invalid token generated by said second unit in response to a set of bits in said bit shifter, said bit shifter unit shifts of said set of bits so that said first unit generates a token in response thereto.

19. A decoder for units of Huffman-coded data, each unit having codewords, said decoder having an input terminal receiving said data and comprising a bit shifter unit holding said received data in order of reception;

a first look-up table unit connected to at least a first portion of said bit shifter unit for generating control signals for shifting said register responsive to the total length of coded units having complete codewords in said first portion of said bit shifter unit; and a plurality of second look-up table units connected to said first portion of said bit shifter unit in a pipeline; said second look-up table units sequentially generating tokens responsive to said complete codewords in said first portion;

whereby said bit shifter unit is shifted for a subsequent decoding operation without the requirement of a decoding of a codeword in said received data.

20. A decoder for units of Huffman-coded data as in claim 19 wherein said plurality of second look-up table units has a first unit for decoding a first codeword in said bit shifter and at least a second unit for decoding a codeword subsequent to said first codeword in said bit shifter, said second unit capable of decoding only a subset of codewords capable of being decoded by said first unit.

21. A decoder for units of Huffman-coded data as in claim 20 wherein said Huffman-coded data comprise JPEG data and said first unit is capable of generating tokens for DC coefficients.

22. A decoder for units of Huffman-coded data as in claim 21 wherein said remaining second look-up table units are capable of generating tokens for AC coefficients.

23. A decoder for units of Huffman-coded data as in claim 20 wherein said first unit is capable of decoding all codewords in said Huffman-coded data.

24. A decoder for units of Huffman-coded data as in claim 19 wherein said plurality of second look-up table units are connected by a plurality of latches and shifters, a latch and shifter associated with each one of said second memory units except one, said one second look-up table unit connected to said first portion of said bit shifter unit in parallel to said first memory, said one second look-up table unit generating a token corresponding to a first complete codeword in said first portion of said bit shifter unit.

25. A decoder for units of Huffman-coded data as in claim 24 wherein a second of said second look-up table units is connected to said associated shifter, said associated shifter connected to said associated latch and to said one second look-up table unit, said one second look-up table unit further generating control bits corresponding to the length of said coded unit of said first complete codeword, said associated latch connected to said first portion of said bit shifter unit in parallel to said first look-up table, said associated shifter shifting said data in said latch responsive to said control bits from said one second look-up table unit so that said second look-up table unit generates a token corresponding to a second complete codeword in said first portion of said bit shifter unit.

26. A decoder for units of Huffman-coded data as in claim 19 wherein each of said second look-up table units comprises a pair of third loop-up table units, a first of said pair generating tokens and a second of said pair generating control signals for sequential look-up operations by said second look-up table units.

27. A decoder for units of Huffman-coded data as in claim 26 wherein said plurality of second look-up table units are connected by a plurality of latches and shifters, a latch and shifter associated with each one of said second memory units except one, said one second look-up table unit comprising a first of a pair of third look-up table units connected to said first portion of said bit shifter unit in parallel to said first memory, said first of said pair generating a token corresponding to a first complete codeword in said first portion of said bit shifter unit; and a second of said pair of third look-up table units responsive to said generated token for generating control signal indicative of a length of said first complete codeword.

28. A decoder for units of Huffman-coded data as in claim 27 wherein a second of said second look-up table units is connected to said associated shifter, said associated shifter connected to said associated latch and to said one second look-up table unit, said associated latch connected to said first portion of said bit shifter unit in parallel to said first look-up table, said associated shifter shifting said data in said latch responsive to said control bits from said second of said pair of third look-up table units so that said second look-up table unit generates a token corresponding to a second complete codeword in said first portion of said bit shifter unit.

29. A Huffman decoder receiving units of Huffman-coded data bits, each unit having a codeword, and holding said bits in order of reception in a plurality of cells, each cell holding a bit, said decoder comprising a plurality of memory units, said memory units connected to a subset of said cells for generating a token corresponding to a codeword in said subset of cells and control bits corresponding to the total number of aid bits associated with a coded data unit of said codeword, each of said memory units connected to said cells to form interleaved connections to said cells; and means, connected to said cells, for selecting one of said memory units for said tokens responsive to said bits in said cells;

whereby the amount of memory space required to decode said Huffman-coded data is substantially reduced.

30. The decoder as in claim 29 wherein input is at least as wide as widest Huffman codeword connected to said address input terminals of said plurality of memory units.

31. The decoder as in claim 29 wherein one of said memory units is capable of generating a plurality of tokens simultaneously corresponding to plurality of codewords in said subset of connected cells.

32. The decoder as in claim 31 wherein said one memory unit is connected to a subset of cells holding the earliest received bits.

33. The decoder as in claim 29 wherein said cells number 0–15, said plurality of memory units comprises three memory units, a first memory unit connected to cells 0–7, a second memory unit connected to cells 4–11, and a third second memory unit connected to cells 8–15.

34. The decoder as in claim 33 wherein said token is encoded with a canonical Huffman code.

35. The decoder as in claim 34 wherein said selecting means is responsive to the location of unique prefix bits in said cells.

36. The decoder as in claim 35 wherein said selecting means is responsive to the location of consecutive bits of the logic "1"'s in said cells.

37. The decoder as in claim 36 wherein said selecting means selects said third memory unit upon determination that cells 0–7 contain logic "1"'s, if not, selects said second memory unit upon determination that cells 0–3 contain logic "1"'s; otherwise, selects said first memory unit.

38. The decoder as in claim 35 wherein said selecting means is responsive to the location of consecutive bits of the logic "0"'s in said cells.

39. The decoder as in claim 38 wherein said selecting means selects said third memory unit upon determination that cells 0–7 contain logic "0"'s; if not, selects said second memory unit upon determination that cells 0–3 contain logic "0"'s; otherwise, selects said first memory unit.

40. The decoder as in claim 29 wherein said data comprises digital transform coefficients and run lengths between nonzero transform coefficients, said memory units generating digital image data comprising the length of a unit of coded data bits, said length associated with said digital transform coefficient, and the length of the mantissa bits.

41. The decoder as in claim 40 wherein each of said memory units has thirteen output terminals.

42. The decoder as in claim 41 wherein five of said output terminals carry said length of said coded data bits, four terminals carry zero run length associated with said digital transform coefficient and four terminals carry said length of said mantissa bits.

43. A method of decoding Huffman-coded data units in a bitstream, each of said coded data units having codewords, said method comprising providing a set of bits of said coded data units at input terminals of a memory unit capable of simultaneously generating a plurality of tokens from codewords in said bits an d a total number of bits of said data units having said tokens generated from said codewords; and shifting said bits in said bitstream by said total number of bits for providing a next set of bits at said input terminals of said memory unit for a subsequent decoding cycle.

44. A method of decoding Huffman-coded data i in a bitstream, each of said coded data units ha codewords, said method comprising providing simultaneously a plurality of sets of bits of said coded data units at input terminals of a plurality of look-up table units respectively, each set of bits staggered in said bitstream from other sets;

generating simultaneously a token from each look-up table unit responsive to a respective set of bits at said input terminals from said look-up table unit;

determining a total number of bits of said data units having tokens generated from codewords in said sets of bits; and shifting said bits in said bitstream by said total number of bits for providing a plurality of next sets of bits at said input terminals of said look-up table units for a subsequent decoding cycle.

45. A method of decoding Huffman-coded data units in a bitstream, each of said coded data units having codewords, said method comprises providing simultaneously a plurality of sets of bits of said coded data units at input terminals of a plurality of look-up table units respectively, each set of bits staggered in said bitstream from other sets;

generating simultaneously a token from each look-up table unit responsive to a respective set of bits at said input terminals from said look-up table unit; and shifting said bits in said bitstream by a predetermined number of bits for providing a plurality of next sets of bits at said input terminals of said look-up table units for a subsequent decoding cycle.

46. The method as in claim 45 wherein said predetermined number of bits corresponds to the greatest amount of stagger between said sets of bits.

47. The method as in claim 45 further comprising
determining the validity of each token from each look-up table;
generating an error signal responsive to the determination of an invalid token from a look-up table responsive to said set; and
shifting back said bits in said bitstream so that said set of bits at said look-up table is provided at input terminals of another look-up table capable of generating a valid token from said set of bits.

48. A method of decoding blocks in a bitstream, where each block comprises at least one variable bit-length codeword of Huffman-coded data, wherein some blocks are not fully populated with codewords to be decoded, the method comprising the steps of:
providing the block to an address input of a length look-up table unit;
reading a length value from a location of said length look-up table unit, where said location is addressed by the block and said length value indicates a total number of bits of the at least one variable bit-length codeword in the block which addresses said length look-up table unit;
generating a token for each codeword in the block; and
shifting bits in the bitstream by said length value, in order to provide a next set of bits comprising a next block to said length look-up table for a subsequent decoding cycle.

49. The method as in claim 48 wherein said generating step comprises the steps of:
providing, from the block, a number of bits equal to said length value to a first codeword look-up table unit for generating a token from a codeword in the block and for generating a bit length of said codeword;
shifting the block by said bit length, resulting in a shifted block;
providing said shifted block to a second codeword look-up table unit for generating a token from a second codeword in said shifted block and for generating a bit length of said second codeword; and
repeating said steps above a predetermined number of times, said predetermined number corresponding to a number of codeword look-up table units.

50. The method as in claim 49 wherein the blocks comprise JPEG data and wherein said first codeword look-up table unit is responsive to DC codewords only and said second codeword look-up table is responsive to AC codewords only.

51. A method of reducing size of a look-up table connected to cells of a bit shifter in a Huffman decoder, said method comprising
providing a plurality of look-up tables;
connecting each of said look-up tables to a subset of said bit shifter cells, each subset interleaved with another;
generating tokens simultaneously by each of said look-up table responsive to bits in said subset of said connected cells; and
selecting valid tokens from said simultaneously generated tokens.

* * * * *

UNITED STATES PATENT AND TRADEMARK OFFICE
CERTIFICATE OF CORRECTION

PATENT NO.   : 5,325,092  
DATED        : June 28, 1994  
INVENTOR(S)  : Allen, et al Page 1 of 6

It is certified that error appears in the above-indentified patent and that said Letters Patent is hereby corrected as shown below:

The title page should be deleted to appear as per attached title page.

Columns 85-86 through column 96 should be deleted and replaced with columns 85-92 as per attached.

Signed and Sealed this

Twenty-fifth Day of June, 1996

Attest:

BRUCE LEHMAN

Attesting Officer

Commissioner of Patents and Trademarks

United States Patent [19]
Allen et al.

[11] Patent Number: 5,325,092
[45] Date of Patent: Jun. 28, 1994

[54] HUFFMAN DECODER ARCHITECTURE FOR HIGH SPEED OPERATION AND REDUCED MEMORY

[75] Inventors: James Allen, Castro Valley; Martin Boliek, Palo Alto; Edward L. Schwartz, Sunnyvale; David Bednash, Palo Alto, all of Calif.

[73] Assignee: Ricoh Company, Ltd., Menlo Park, Calif.; Ricoh Company, Ltd., Tokyo, Japan

[21] Appl. No.: 909,903

[22] Filed: Jul. 7, 1992

[51] Int. Cl.⁵ .............................................. H03M 7/40
[52] U.S. Cl. ....................................... 341/65; 341/67
[58] Field of Search ................................. 341/65, 67

[56] References Cited
U.S. PATENT DOCUMENTS

| | | | |
|---|---|---|---|
| 4,647,908 | 3/1987 | Ross et al. | 341/65 |
| 4,899,148 | 2/1990 | Sato et al. | 341/65 |
| 4,899,149 | 2/1990 | Kahan | 341/67 |
| 5,091,955 | 2/1992 | Iseda et al. | 381/36 |
| 5,138,316 | 8/1992 | Konishi | 341/67 |

Primary Examiner—Marc S. Hoff
Attorney, Agent, or Firm—Townsend and Townsend Khourie and Crew

[57] ABSTRACT

Various Huffman decoder architectures are presented. By these decoder architectures, more than one codeword in a stream of Huffman-coded data units may be decoded into more than one token in a single decoding operation on average. An efficient memory organization which is useful in many of these decoder architectures is also presented.

51 Claims, 11 Drawing Sheets

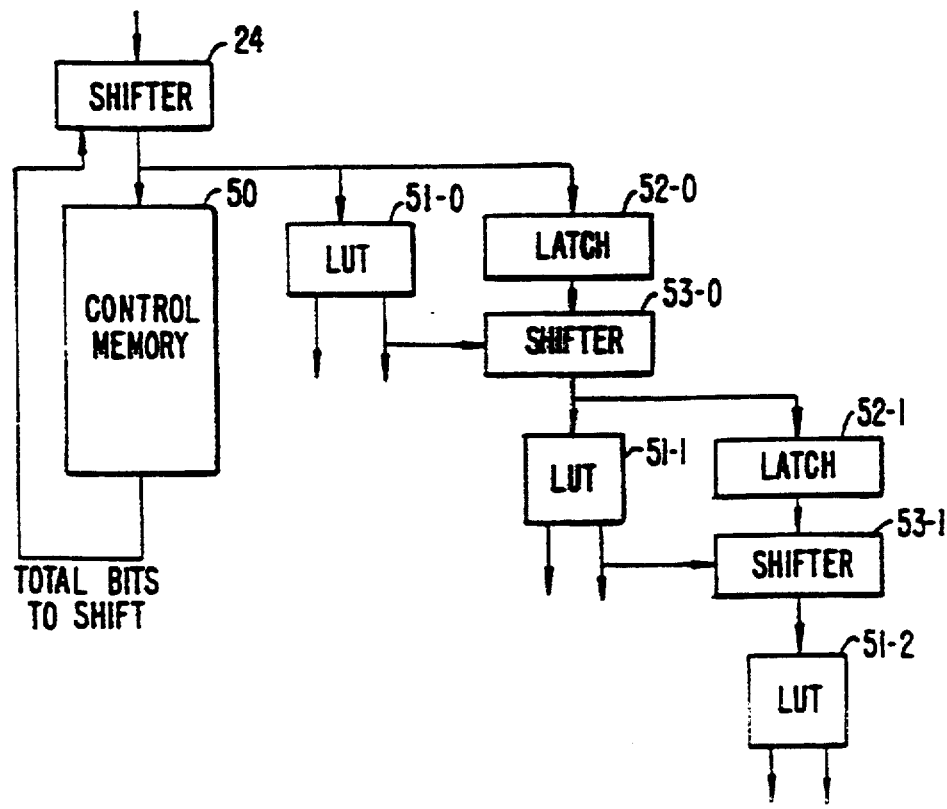

| Inputs (from stagger position) | | | | | | | | Output | Inputs (from stagger position) | | | | | | | | Output | Inputs (from stagger position) | | | | | | | | Output |
| 0 | 1 | 2 | 3 | 4 | 5 | 6 | 7 | | 0 | 1 | 2 | 3 | 4 | 5 | 6 | 7 | | 0 | 1 | 2 | 3 | 4 | 5 | 6 | 7 | |
|---|---|---|---|---|---|---|---|---|---|---|---|---|---|---|---|---|---|---|---|---|---|---|---|---|---|---|
| 2 | XX | 5 | XX | XX | 6 | 7 | 34 | 34 | | | | | | | | | | | | | | | | | | |
| 1 | 2 | 5 | XX | XX | 6 | 7 | 34 | 34 | | | | | | | | | | | | | | | | | | |
| 3 | XX | XX | 5 | XX | 6 | 7 | 34 | 34 | | | | | | | | | | | | | | | | | | |
| 1 | 3 | XX | 5 | XX | 6 | 7 | 34 | 34 | | | | | | | | | | | | | | | | | | |
| 2 | XX | 3 | 5 | XX | 6 | 7 | 34 | 34 | | | | | | | | | | | | | | | | | | |
| 1 | 2 | 3 | 5 | XX | 6 | 7 | 34 | 34 | | | | | | | | | | | | | | | | | | |
| 4 | XX | XX | XX | 5 | 6 | 7 | 34 | 34 | | | | | | | | | | | | | | | | | | |
| 1 | 4 | XX | XX | 5 | 6 | 7 | 34 | 34 | | | | | | | | | | | | | | | | | | |
| 2 | XX | 4 | XX | 5 | 6 | 7 | 34 | 34 | | | | | | | | | | | | | | | | | | |
| 1 | 2 | 4 | XX | 5 | 6 | 7 | 34 | 34 | | | | | | | | | | | | | | | | | | |
| 3 | XX | XX | 4 | 5 | 6 | 7 | 34 | 34 | | | | | | | | | | | | | | | | | | |
| 1 | 3 | XX | 4 | 5 | 6 | 7 | 34 | 34 | | | | | | | | | | | | | | | | | | |
| 2 | XX | 3 | 4 | 5 | 6 | 7 | 34 | 34 | | | | | | | | | | | | | | | | | | |
| 1 | 2 | 3 | 4 | 5 | 6 | 7 | 34 | 34 | | | | | | | | | | | | | | | | | | |

What is claimed is:

1. A decoder for units of Huffman-coded data, each unit having codewords, said decoder having an input terminal receiving said data and comprising
    a bit shifter unit, connected to said input terminal, having a plurality of cells, each of cell holding a bit of said received data; and
    a memory unit having a plurality of input address terminals and output terminals, each of said address terminals connected to one of said bit shifter cells, said memory unit generating tokens at said output terminals simultaneously from each complete codeword at said input address terminals, said memory unit generating control signals corresponding to the total length of said coded data units having complete codewords at said input address terminals so that said coded data may be shifted through said bit shifter unit, wherein at least tokens are stored at addresses of said memory unit, and wherein at least one address of said memory unit stores more than one token at an address, said address being a concatenation of more than one codeword;
    whereby said coded data units are decoded simultaneously and said bit shifter unit is ready for a next decoding cycle.

2. A decoder as in claim 1 wherein said memory unit is at least as many input terminals as the largest codeword in said Huffman-coded data.

3. A decoder as in claim 2 wherein said memory unit is capable of generating tokens for all codewords at only a subset of said input address terminals whereby size of said memory unit is reduced.

4. A decoder as in claim 3 wherein said memory unit is capable of generating tokens for all codewords only for a first positioned codeword in said bit shifter unit.

5. A decoder as in claim 4 wherein said memory unit is capable of generating tokens for a subset of codewords at locations other than said first positioned codeword in said bit shifter unit, said subset of codewords being the most frequently occurring.

6. A decoder receiving units of Huffman-coded data, each unit having a codeword, in the form of bits, said decoder comprising
    a bit shifter unit holding said bits of received data in order or reception;
    a plurality of look-up table units connected to said bit shifter unit such that each of said look-up table units simultaneously generates tokens responsive to a plurality of bits staggered in order of reception; and
    logic means, connected to said look-up table units, for determining which of said look-up table units has generated valid tokens;
    whereby said decoder decodes in one cycle one or more units of received data having bits of a complete codeword causing a look-up table unit to generate a token.

7. The decoder as in claim 6 wherein said logic means further determines the total amount of bits to be shifted by said bit shifter unit for a next decoding cycle.

8. The decoder as in claim 6 wherein a connection of each look-up table unit to said bit shifter unit is staggered by one bit.

9. The decoder as in claim 6 wherein a connection of each look-up table unit to said bit shifter unit is staggered by amounts corresponding to the most likely occurring combinations of coded data units.

10. The decoder as in claim 6 wherein said units of Huffman-coded data correspond to a plurality of Huffman codes and said look-up table units generate a plurality of tokens in parallel, one token for each Huffman code.

11. The decoder as in claim 10 wherein said plurality of look-up table units generate four tokens in parallel, one token each for AC Luminance, DC Luminance, AC Chrominance and DC Chrominance Huffman codes.

12. The decoder as in claim 6 wherein said plurality of look-up table units comprises a first unit connected to an initial position of said bit shifter unit and at least one second unit connected to said bit shifter unit offset from said initial position, said first unit generating tokens for all possible codewords, and said second unit generating tokens for a subset of all possible codewords.

13. The decoder as in claim 6 wherein the total amount of bits to be shifted by said bit shifter unit for a next decoding cycle is fixed.

14. The decoder as in claim 13 wherein said units of Huffman-coded data correspond to a plurality of Huffman codes and said look-up table units generate a plurality of tokens in parallel, one token for each Huffman code.

15. The decoder as in claim 14 wherein said plurality of look-up table units generate four tokens in parallel, one token each for AC Luminance, DC Luminance, AC Chrominance and DC Chrominance Huffman codes.

16. The decoder as in claim 15 wherein a connection of each look-up table unit to said bit shifter unit is staggered by one bit.

17. The decoder as in claim 13 wherein said plurality of look-up table units comprises a first unit connected to an initial position of said bit shifter unit and at least one second unit connected to said bit shifter unit offset from said initial position, said first unit generating tokens for all possible codewords, and said second unit generating tokens for a subset of all possible codewords.

18. The decoder of claim 17 wherein responsive to an invalid token generated by said second unit in response to a set of bits in said bit shifter, said bit shifter unit shifts of said set of bits so that said first unit generates a token in response thereto.

19. A decoder for units of Huffman-coded data, each unit having codewords, said decoder having an input terminal receiving said data and comprising
- a bit shifter unit holding said received data in order of reception;
- a first look-up table unit connected to at least a first portion of said bit shifter unit for generating control signals for shifting said register responsive to the total length of coded units having complete codewords in said first portion of said bit shifter unit; and
- a plurality of second look-up table units connected to said first portion of said bit shifter unit in a pipeline; said second look-up table units sequentially generating tokens responsive to said complete codewords in said first portion;
- whereby said bit shifter unit is shifted for a subsequent decoding operation without the requirement of a decoding of a codeword in said received data.

20. A decoder for units of Huffman-coded data as in claim 19 wherein said plurality of second look-up table units has a first unit for decoding a first codeword in said bit shifter and at least a second unit for decoding a codeword subsequent to said first codeword in said bit shifter, said second unit capable of decoding only a subset of codewords capable of being decoded by said first unit.

21. A decoder for units of Huffman-coded data as in claim 20 wherein said Huffman-coded data comprise JPEG data and said first unit is capable of generating tokens for DC coefficients.

22. A decoder for units of Huffman-coded data as in claim 21 wherein said remaining second look-up table units are capable of generating tokens for AC coefficients.

23. A decoder for units of Huffman-coded data as in claim 20 wherein said first unit is capable of decoding all codewords in said Huffman-coded data.

24. A decoder for units of Huffman-coded data as in claim 19 wherein said plurality of second look-up table units are connected by a plurality of latches and shifters, a latch and shifter associated with each one of said second memory units except one, said one second look-up table unit connected to said first portion of said bit shifter unit in parallel to said first memory, said one second look-up table unit generating a token corresponding to a first complete codeword in said first portion of said bit shifter unit.

25. A decoder for units of Huffman-coded data as in claim 24 wherein a second of said second look-up table units is connected to said associated shifter, said associated shifter connected to said associated latch and to said one second look-up table unit, said one second look-up table unit further generating control bits corresponding to the length of said coded unit of said first complete codeword, said associated latch connected to said first portion of said bit shifter unit in parallel to said first look-up table, said associated shifter shifting said data in said latch responsive to said control bits from said one second look-up table unit so that said second look-up table unit generates a token corresponding to a second complete codeword in said first portion of said bit shifter unit.

26. A decoder for units of Huffman-coded data as in claim 19 wherein each of said second look-up table units comprises a pair of third look-up table units, a first of said pair generating tokens and a second of said pair generating control signals for sequential look-up operations by said second look-up table units.

27. A decoder for units of Huffman-coded data as in claim 26 wherein said plurality of second look-up table units are connected by a plurality of latches and shifters, a latch and shifter associated with each one of said second memory units except one, said one second look-up table unit comprising
- a first of a pair of third look-up table units connected to said first portion of said bit shifter unit in parallel to said first memory, said first of said pair generating a token corresponding to a first complete codeword in said first portion of said bit shifter unit; and
- a second of said pair of third look-up table units responsive to said generated token for generating control signal indicative of a length of said first complete codeword.

28. A decoder for units of Huffman-coded data as in claim 27 wherein a second of said second look-up table units is connected to said associated shifter, said associated shifter connected to said associated latch and to said one second look-up table unit, said associated latch connected to said first portion of said bit shifter unit in parallel to said first look-up table, said associated shifter shifting said data in said latch responsive to said control bits from said second of said pair of third look-up table units so that said second look-up table unit generates a token corresponding to a second complete codeword in said first portion of said bit shifter unit.

29. A Huffman decoder receiving units of Huffman-coded data bits, each unit having a codeword, and holding said bits in order of reception in a plurality of cells, each cell holding a bit, said decoder comprising
- a plurality of memory units, said memory units connected to a subset of said cells for generating a token corresponding to a codeword in said subset of cells and control bits corresponding to the total number of aid bits associated with a coded data unit of said codeword, each of said memory units connected to said cells to form interleaved connections to said cells; and
- means, connected to said cells, for selecting one of said memory units for said tokens responsive to said bits in said cells;
- whereby the amount of memory space required to decode said Huffman-coded data is substantially reduced.

30. The decoder as in claim 29 wherein input is at least as wide as widest Huffman codeword connected to said address input terminals of said plurality of memory units.

31. The decoder as in claim 29 wherein one of said memory units is capable of generating a plurality of tokens simultaneously corresponding to plurality of codewords in said subset of connected cells.

32. The decoder as in claim 31 wherein said one memory unit is connected to a subset of cells holding the earliest received bits.

33. The decoder as in claim 29 wherein said cells number 0-15, said plurality of memory units comprises three memory units, a first memory unit connected to cells 0-7, a second memory unit connected to cells 4-11, and a third second memory unit connected to cells 8-15.

34. The decoder as in claim 33 wherein said token is encoded with a canonical Huffman code.

35. The decoder as in claim 34 wherein said selecting means is responsive to the location of unique prefix bits in said cells.

36. The decoder as in claim 35 wherein said selecting means is responsive to the location of consecutive bits of the logic "1"'s in said cells.

37. The decoder as in claim 36 wherein said selecting means selects said third memory unit upon determination that cells 0-7 contain logic "1"'s, if not, selects said second memory unit upon determination that cells 3-3 contain logic "1"'s; otherwise, selects said first memory unit.

38. The decoder as in claim 35 wherein said selecting means is responsive to the location of consecutive bits of the logic "0"'s in said cells.

39. The decoder as in claim 38 wherein said selecting means selects said third memory unit upon determination that cells 0-7 contain logic "0"'s; if not, selects said second memory unit upon determination that cells 0-3 contain logic "0"'s; otherwise, selects said first memory unit.

40. The decoder as in claim 29 wherein said data comprises digital transform coefficients and run lengths between nonzero transform coefficients, said memory units generating digital image data comprising the length of a unit of coded data bits, said length associated with said digital transform coefficient, and the length of the mantissa bits.

41. The decoder as in claim 40 wherein each of said memory units has thirteen output terminals.

42. The decoder as in claim 41 wherein five of said output terminals carry said length of said coded data bits, four terminals carry zero run length associated with said digital transform coefficient and four terminals carry said length of said mantissa bits.

43. A method of decoding Huffman-coded data units in a bitstream, each of said coded data units having codewords, said method comprising
providing a set of bits of said coded data units at input terminals of a memory unit capable of simultaneously generating a plurality of tokens from codewords in said bits an d a total number of bits of said data units having said tokens generated from said codewords; and
shifting said bits in said bitstream by said total number of bits for providing a next set of bits at said input terminals of said memory unit for a subsequent decoding cycle.

44. A method of decoding Huffman-coded data : in a bitstream, each of said coded data units having codewords, said method comprising
providing simultaneously a plurality of sets of bits of said coded data units at input terminals of a plurality of look-up table units respectively, each set of bits staggered in said bitstream from other sets;
generating simultaneously a token from each look-up table unit responsive to a respective set of bits at said input terminals from said look-up table unit;
determining a total number of bits of said data units having tokens generated from codewords in said sets of bits; and
shifting said bits in said bitstream by said total number of bits for providing a plurality of next sets of bits at said input terminals of said look-up table units for a subsequent decoding cycle.

45. A method of decoding Huffman-coded data units in a bitstream, each of said coded data units having codewords, said method comprises
providing simultaneously a plurality of sets of bits of said coded data units at input terminals of a plurality of look-up table units respectively, each set of bits staggered in said bitstream from other sets;
generating simultaneously a token from each look-up table unit responsive to a respective set of bits at said input terminals from said look-up table unit; and
shifting said bits in said bitstream by a predetermined number of bits for providing a plurality of next sets of bits at said input terminals of said look-up table units for a subsequent decoding cycle.

46. The method as in claim 45 wherein said predetermined number of bits corresponds to the greatest amount of stagger between said sets of bits.

47. The method as in claim 45 further comprising
determining the validity of each token from each look-up table;
generating an error signal responsive to the determination of an invalid token from a look-up table responsive to said set; and
shifting back said bits in said bitstream so that said set of bits at said look-up table is provided at input terminals of another look-up table capable of generating a valid token from said set of bits.

48. A method of decoding blocks in a bitstream, where each block comprises at least one variable bit-length codeword of Huffman-coded data, wherein some blocks are not fully populated with codewords to be decoded, the method comprising the steps of:
providing the block to an address input of a length look-up table unit;
reading a length value from a location of said length look-up table unit, where said location is addressed by the block and said length value indicates a total number of bits of the at least one variable bit-length codeword in the block which addresses said length look-up table unit;
generating a token for each codeword in the block; and
shifting bits in the bitstream by said length value, in order to provide a next set of bits comprising a next block to said length look-up table for a subsequent decoding cycle.

49. The method as in claim 48 wherein said generating step comprises the steps of:
providing, from the block, a number of bits equal to said length value to a first codeword look-up table unit for generating a token from a codeword in the block and for generating a bit length of said codeword;
shifting the block by said bit length, resulting in a shifted block;
providing said shifted block to a second codeword look-up table unit for generating a token from a second codeword in said shifted block and for generating a bit length of said second codeword; and
repeating said steps above a predetermined number of times, said predetermined number corresponding to a number of codeword look-up table units.

50. The method as in claim 49 wherein the blocks comprise JPEG data and wherein said first codeword look-up table unit is responsive to DC codewords only and said second codeword look-up table is responsive to AC codewords only.

51. A method of reducing size of a look-up table connected to cells of a bit shifter in a Huffman decoder, said method comprising providing a plurality of look-up tables;

connecting each of said look-up tables to a subset of said bit shifter cells, each subset interleaved with another;

generating tokens simultaneously by each of said look-up table responsive to bits in said subset of said connected cells; and selecting valid tokens from said simultaneously generated tokens.

* * * * *

UNITED STATES PATENT AND TRADEMARK OFFICE
CERTIFICATE OF CORRECTION

PATENT NO. : 5,325,092

DATED : June 28, 1994

INVENTOR(S) : James Allen, et al.

It is certified that error appears in the above-identified patent and that said Letters Patent is hereby corrected as shown below:

On the title page: Item [73], Assignee: should read

RICOH COMPANY, LTD., Tokyo, Japan;
RICOH CORPORATION, Menlo Park, CA.

Signed and Sealed this

Fifteenth Day of October, 1996

*Attest:*

BRUCE LEHMAN

*Attesting Officer*    *Commissioner of Patents and Trademarks*